United States Patent [19]
Ando et al.

[11] Patent Number: 5,989,759
[45] Date of Patent: Nov. 23, 1999

[54] PATTERN FORMING METHOD USING ALIGNMENT FROM LATENT IMAGE OR BASE PATTERN ON SUBSTRATE

[75] Inventors: Atsushi Ando, Tokyo; Kazuyoshi Sugihara, Yokosuka; Katsuya Okumura; Tetsuro Nakasugi, both of Yokohama, all of Japan

[73] Assignee: Kabushiki Kaisha Toshiba, Kawasaki, Japan

[21] Appl. No.: 09/030,886

[22] Filed: Feb. 26, 1998

[30] Foreign Application Priority Data

Feb. 28, 1997 [JP] Japan ................................. 9-046808
Jan. 29, 1998 [JP] Japan ................................. 10-016619

[51] Int. Cl.$^6$ ....................................................... G03F 9/00
[52] U.S. Cl. ............................. 430/22; 430/30; 430/296; 430/942
[58] Field of Search .............................. 430/22, 30, 296, 430/328, 942

[56] References Cited

U.S. PATENT DOCUMENTS 5,783,340  7/1998  Farino et al. .............................. 430/22
5,863,680  1/1999  Kawakubo et al. ....................... 430/22

FOREIGN PATENT DOCUMENTS 9-7924  1/1997  Japan .

OTHER PUBLICATIONS

F. Benistant et al., A Heavy Ion Implanted Pocket 1.10 μm n–type Metal–Oxide–Semiconductor Field Effect Transistor With Hybrid Lithography (Electron–Beam/Deep Ultraviolet) and Specific Gate Passivation Process), J.Vac. Sci. Technol. B 14(6):4051–4054 (1996).

R. Jonckheere et al., "Electron Beam/DUV Intra–Level Mix–and–Match Lithography for Random Logic 0.25 μm CMOS", Microelectronic Engineering, 27:231–234 (1995).

*Primary Examiner*—Christopher G. Young
*Attorney, Agent, or Firm*—Finnegan, Henderson, Farabow, Garrett & Dunner, L.L.P.

[57] ABSTRACT

To achieve down-sizing and improvements of throughputs, light exposure and charge beam exposure are sometimes used together. In case of performing exposure of a desired pattern in a plurality of stages, a positional displacement of each of exposure patterns in the stages leads to a decrease in exposure accuracy. According to the present invention, in case of forming a fine pattern by exposure after exposure of a rough pattern, the exposure position of the rough pattern is adjusted, based on a latent image of the rough pattern which has been subjected to exposure. As a result, a positional displacement between rough and fine patterns is reduced so that a desired pattern can be formed with high accuracy.

22 Claims, 23 Drawing Sheets

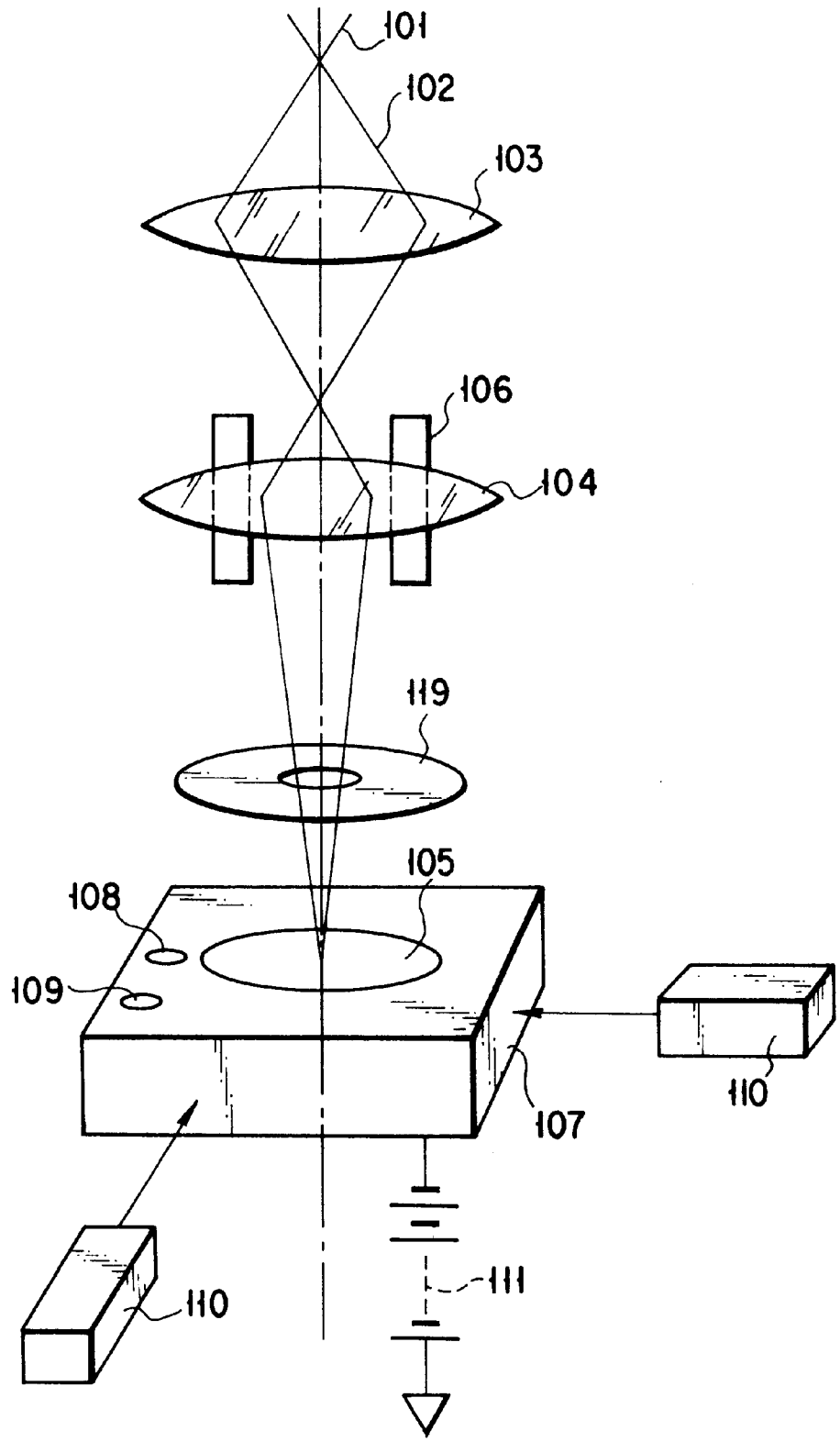
F I G. 5

120: LATENT IMAGE

121: BASE PATTERN IMAGE

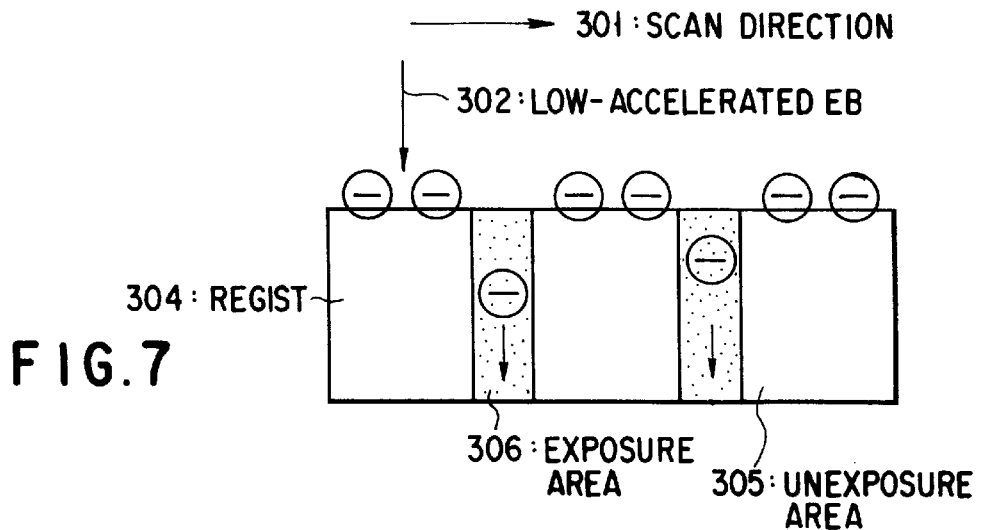
F I G. 7
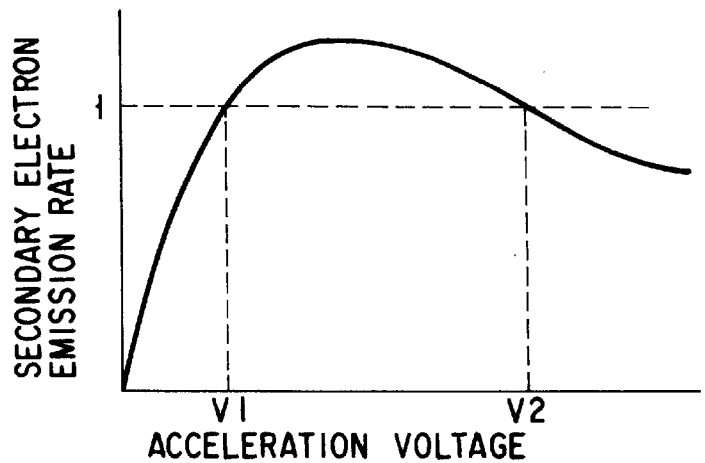
F I G. 8
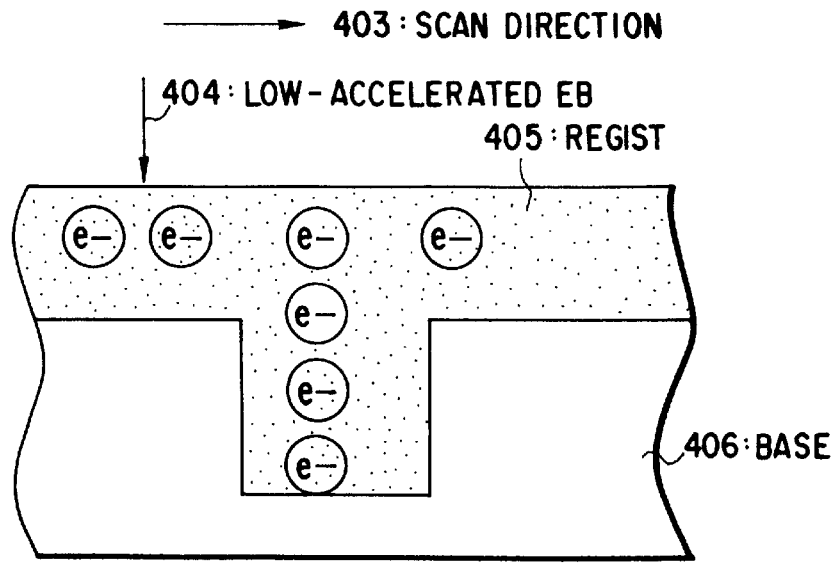
F I G. 11

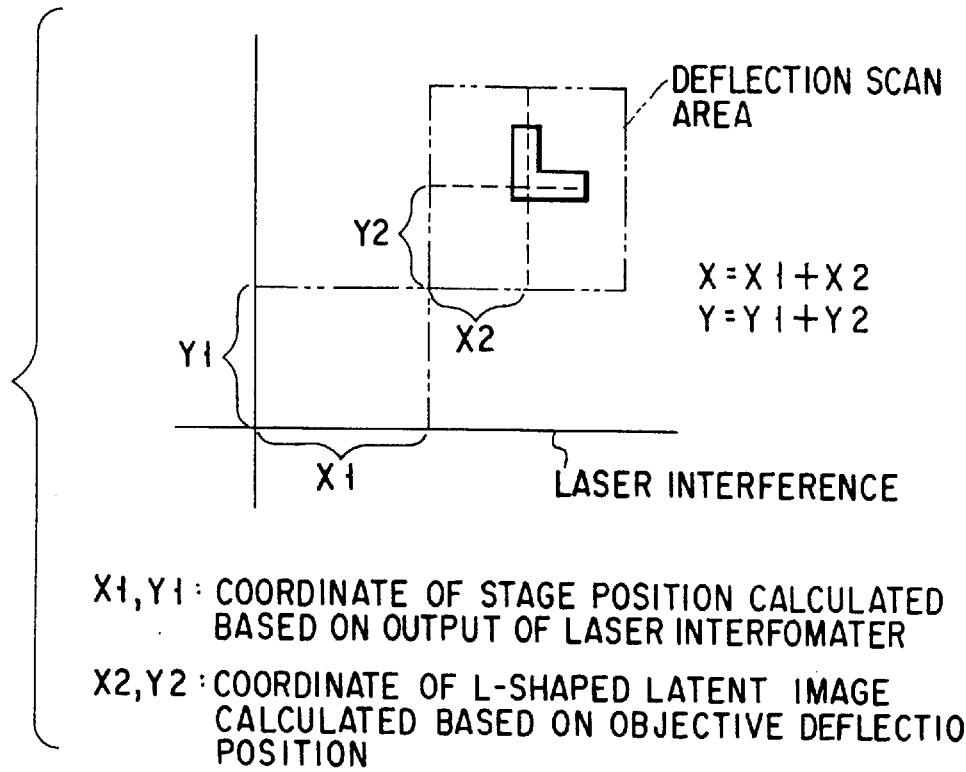
X1,Y1 : COORDINATE OF STAGE POSITION CALCULATED BASED ON OUTPUT OF LASER INTERFOMATER
X2,Y2 : COORDINATE OF L-SHAPED LATENT IMAGE CALCULATED BASED ON OBJECTIVE DEFLECTION POSITION
F I G. 9
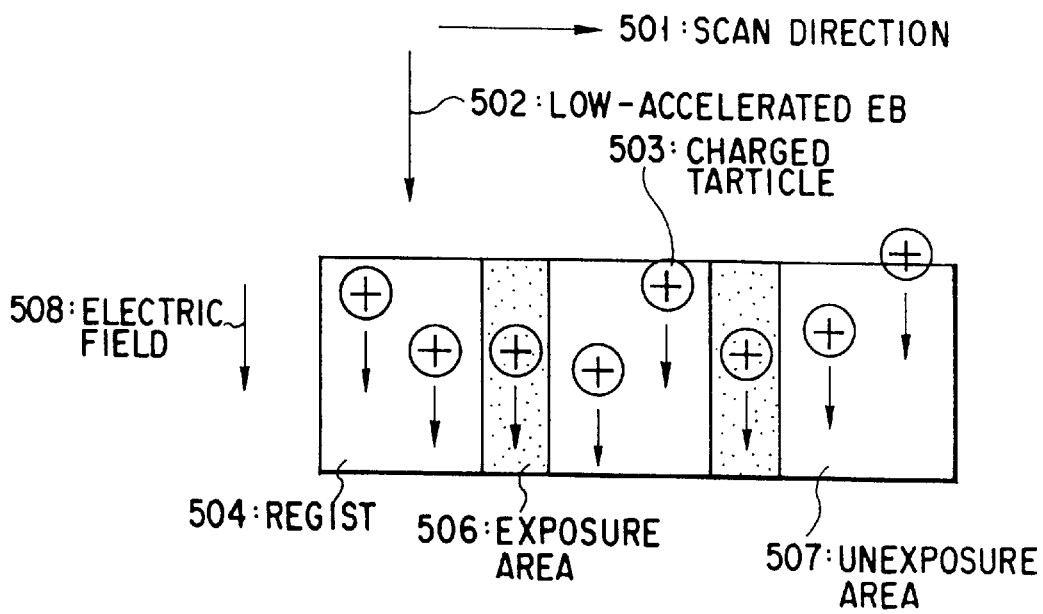
F I G. 15

Acc:1850V

Acc:800V

Acc:1850V

PATTERN FORMING METHOD USING ALIGNMENT FROM LATENT IMAGE OR BASE PATTERN ON SUBSTRATE

BACKGROUND OF THE INVENTION

The present invention relates to a pattern forming method for forming patterns of a semiconductor integrated circuit, including a fine small pattern, with a high accuracy and a high throughput.

In a semiconductor manufacture method, an optical lithography has been used widely for manufacturing devices because of its processing simplicity and low cost. Technical developments have been continuously made, and in recent years, downsizing of an element to 0.25 μm or less has come to be nearly achieved by introducing short waves (e.g., by a KrF excimer laser light source). To further prosecuting the downsizing, developments in ArF excimer laser light sources using a much shorter wave and phase shift masks of a Levenson type have been made and those light sources and masks are expected to be mass-production lithography tools capable of respond to 0.15 μm rules. However, since many problems exist in view of realizing such tools, the development period thereof has prolonged and there is a fear that the development of such tools cannot catch up with the speed of downsizing.

In contrast, in case of an electronic beam lithography as a candidate for a post light lithography, it has been proved that processing up to 0.01 μm can be carried out with use of a narrow converged beam. Although this lithography method will not lead to any problem from the viewpoint of downsizing, its throughput suggests several problems. More specifically, since fine small patterns are drawn, one after another, drawing of patterns inevitably takes a longer time period. In order to shorten the drawing time period, several devices have been developed, for example, including a cell projection method in which a repeatable part common to ULSI patterns is partially drawn at once. However, even with use of those devices, the electronic beam lithography cannot yet catch up with the throughput obtained by a light lithography.

As a method for increasing the throughput of the electronic beam lithography, there has been a proposal of a method in which pattern transfer onto one same resist is carried out by means of light exposure and electronic beam exposure, so that the exposure area to be exposed to an electron beam is reduced and the number of wafers which an electronic beam drawing device can process per hour is thereby increased, i.e., a so-called Mixed and Match method of mixing and matching light and an electron beam (EB) in one same layer.

Japanese Patent Application KOKAI Publication No. 4-155812 discloses that pattern transfer onto one same resist is carried out by means of light exposure and electron beam exposure using a phase shift mask in a lithography step of forming a pattern. In this publication, most of patterns for constructing elements are transferred by a phase shift mask and drawing with an electron beam is used to compensate for a portion which causes a trouble due to positioning by a phase shifter, so that the area to be drawn with a electron beam is reduced as much as possible. In this manner, the number of wafers which an electron beam drawing device can process per hour is increased.

However, in this method, the drawing area is small but a pattern requiring a resolution lower than the limit resolution of the shift mask cannot be transferred, so that it is impossible to respond to further downsizing of devices. In addition, exposure is carried out two times for one same resist, one time being by light exposure and the other time being by electron beam exposure, and therefore, a positional displacement between the two times will lead to a significant problem.

In case of manufacturing various types of elements in units of small lots, preparation of masks requires a long time period. As a countermeasure for solving this problem, Japanese Patent Application KOKAI Publication No. 1-293616 discloses a method in which a group of function blocks common to various types of semiconductor elements is exposed to light while a pattern respectively inherent to only one type of semiconductor elements is drawn with an electron beam. Specifically, a mask common to various types of elements is previously prepared and a portion in which a pattern should be changed is drawn by electron beam drawing. In this method, masks need not be prepared respectively for various types of masks, so that the time period from design of an element to manufacture thereof can be shortened.

However, this method cannot respond to a case in which a function block includes a pattern of a resolution lower than the limit resolution of light exposure, either, like in the method described before. In addition, since patterns to be drawn with an electron beam are wiring portions or the like and patterns must be drawn, one after another, in case of adopting electron beam exposure, a long time is required inevitably. Further, the problem of a positional displacement between light exposure and electron beam exposure still exists unsolved.

Thus, the conventionally used Mix and Match method of using light and an electron beam in one same layer results in problems that high resolution performance of electron beam exposure cannot be sufficiently effected and the throughput cannot achieve the same level as a light stepper.

BRIEF SUMMARY OF THE INVENTION

The present invention has an object of providing a pattern forming method capable of forming a fine small pattern with high accuracy at a high throughput.

In order to achieve both down-sizing and improvement of a throughput, light exposure and charge beam exposure are sometimes used together. In this case, a difference in exposure position between the light exposure and the charge exposure leads to a decrease of pattern forming accuracy. According to the present invention, when exposure of a second pattern is performed after exposure of a first pattern, the exposure position of the second pattern is adjusted on the basis of a latent image of the first pattern which has already been subjected to exposure. As a result, a positional displacement between the first and second pattern can be reduced so that a desired pattern can be formed with high accuracy.

In addition, a displacement of an exposure position of a pattern can be reduced by directly adjusting the exposure position of a pattern, based on a surface pattern on a substrate.

Further, in case of detecting a latent image or a surface pattern by means of a charge beam, a sensitive material is exposed by the charge beam for detection, and therefore, energy of the charge beam is set such that only a surface portion of the sensitive material is exposed but any other portion deeper than the surface portion is not exposed. Accordingly, a portion which is unnecessarily exposed by irradiation of a charge beam for detecting a latent image or a surface pattern can be removed with only first and second patterns kept remaining, i.e., with only a desired pattern kept remaining, by removing the surface portion by thinning the sensitive material and further by developing the thinned sensitive material.

Instead of the manner as described above, it is possible to prevent formation of an unnecessary exposed portion itself, by detecting a latent image or a surface pattern with use of light having a wavelength which cannot be sensed by a sensitive material, or by setting an irradiation amount of light to a value smaller than an irradiation amount with which a sensitive material is exposed.

Further, if the position of a latent image thus obtained is displaced by a predetermined distance or more from a designed position, the sensitive material is peeled, and coating of a sensitive material and exposure thereof are performed again. In this manner, wasteful development processing can be prevented and omitted, and the throughput can be improved thereby.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a view showing a structure of the electron exposure device in FIG. 1.

FIG. 7 is a view for explaining a principle of detecting a latent image.

FIG. 8 is a graph showing a change of efficiency of generating secondary electrons with respect to an accelerated voltage.

FIG. 9 is a schematic view for explaining a method for obtaining a position of an image.

FIG. 11 is a view for explaining a principle of detecting a base pattern.

FIG. 15 is a view explaining difficulties in charging a resist surface to have a positive polarity.

DETAILED DESCRIPTION OF THE INVENTION

In the following, preferred embodiments of the present invention will be explained with reference to the drawings. At first, a Mix and Match method as a base of the present invention depending on light exposure and electron beam (EB) exposure will be briefly explained.

Figure 1:
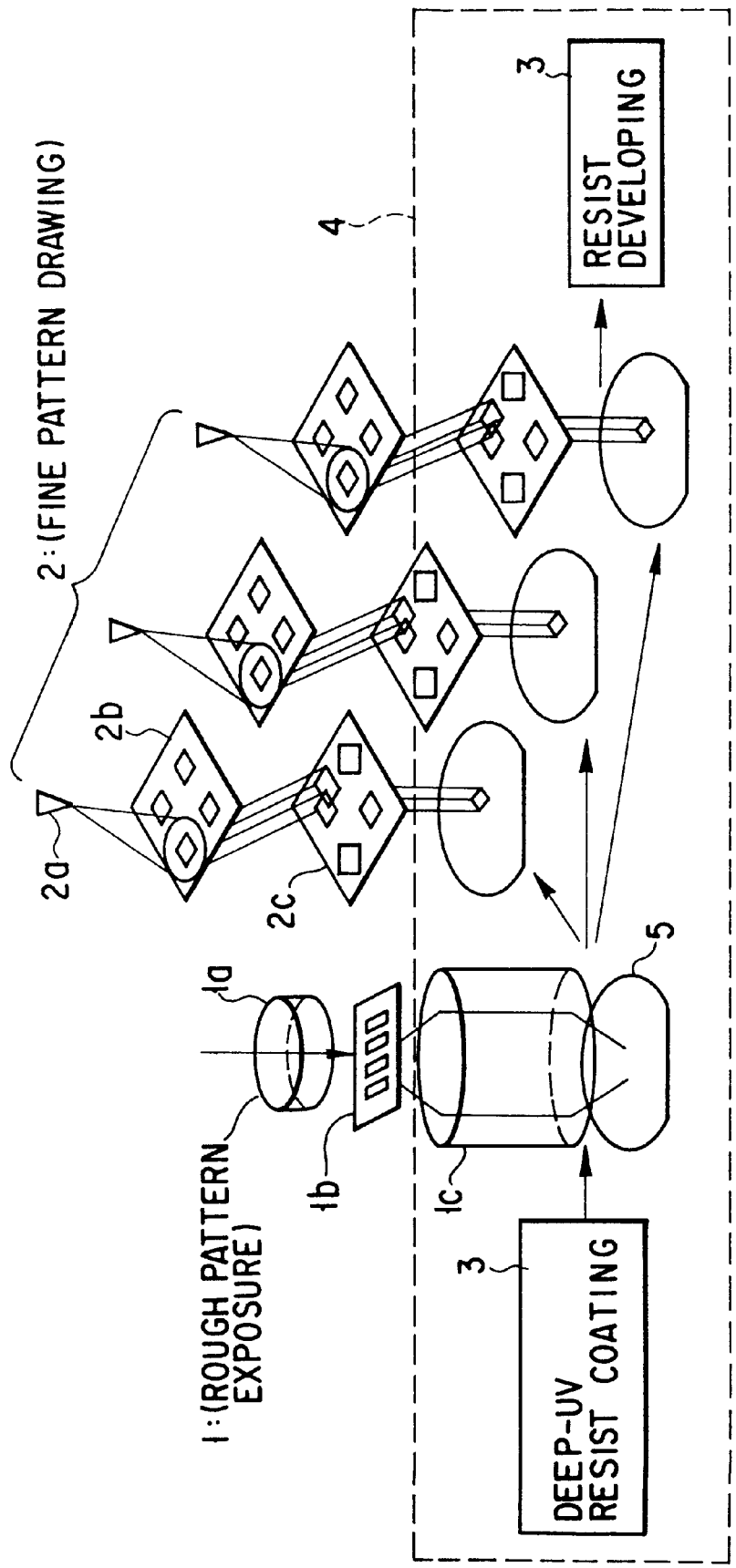
FIG. 1 is a view showing a schematic structure of a lithography system according to a preferred embodiment of the present invention.
Figure 2:
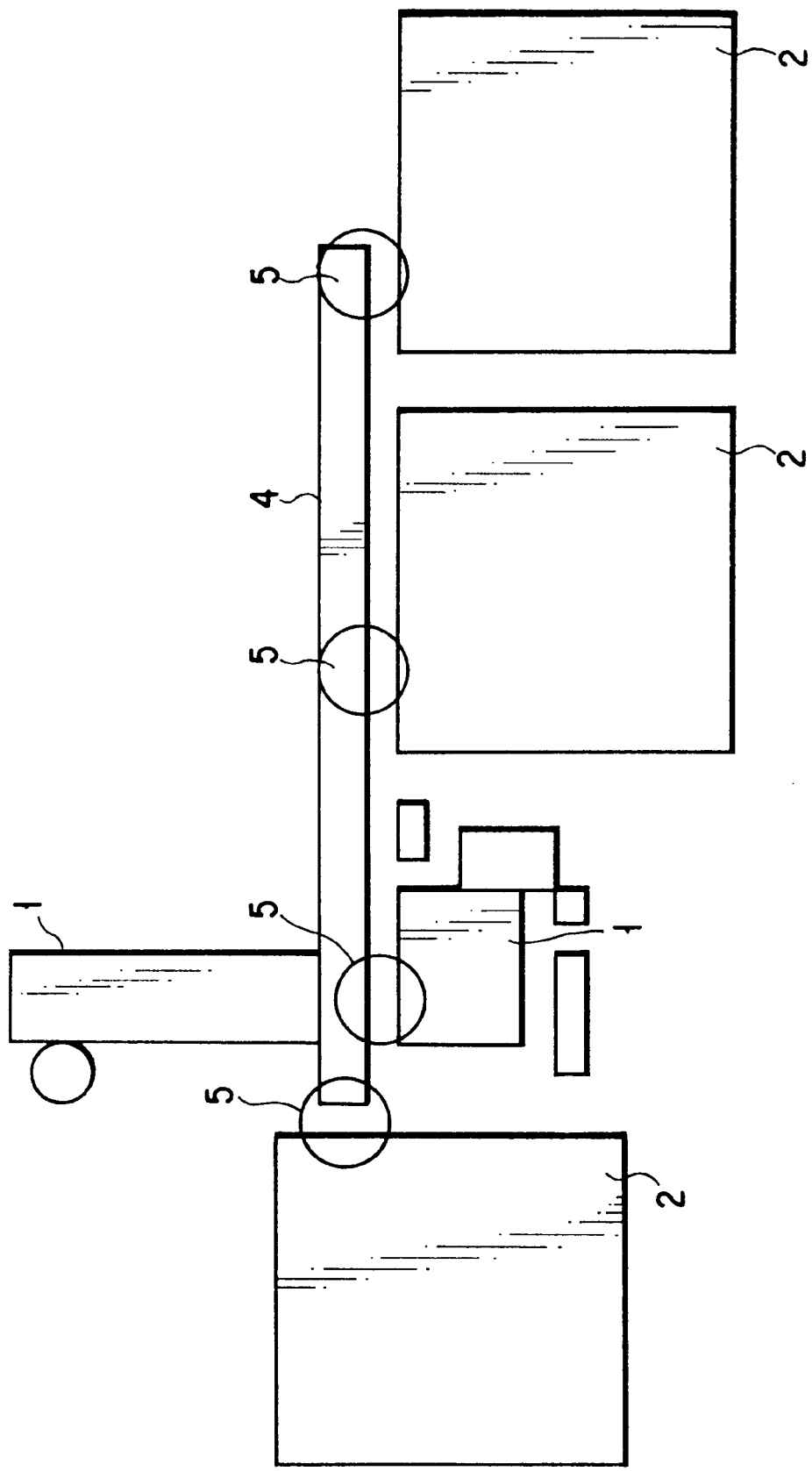
FIG. 2 is a view showing a planer layout of a lithography system shown in FIG. 1.

FIGS. 1 and 2 are views explaining the Mix and Match method. In the figures, a reference 1 denotes a light stepper consisting of, for example, a deep-UV stepper. A reference 2 denotes an electron beam exposure device adopting a cell-projection method, and a plurality of devices 2 are provided. A reference 3 denotes a resist coating/developing device for coating a resist and a anti-reflection film and for developing a resist coated with a pattern. A reference 4 is a transport mechanism for transporting wafers between devices 1, 2, and 3 in an environment under atmospheric control, in order to process a resist by in-line processing. A reference 5 denotes a semiconductor wafer as a substrate to be processed.

In the light stepper 1, references 1a, 1b, and 1c respectively denote an irradiation lens, a photo mask on which a part of an LSI pattern is formed, and a projection lens. In the electron beam exposure device 2, a reference 2a denotes an electron gun and references 2b and 2c denote shaping aperture masks. A beam having a shape of a basic figure such as a rectangle, a triangle, or the like, or a beam having a cell shape as a base of repetition can be shaped by optical overlaying of the shaping aperture masks.

In a lithography system constructed as described above, a wafer 5 coated with an anti-reflection film and a resist by the resist coating/developing device 3 is conveyed to the light stepper 1 by the transport mechanism 4. In order to prevent charging-up when exposing the wafer with an electron beam, at least one of the resist and the anti-reflection film should preferably be conductive. In the light stepper 1, the wafer 5 is exposed to light in form of minified patterns of reticles, sequentially, over the entire surface of the wafer 5. In other words, a rough pattern with relatively low dimensional accuracy is drawn on the wafer 5, among patterns to be formed on the wafer 5.

Upon completion of light exposure, the wafer 5 is conveyed to the electron beam exposure device 2 by the transport mechanism 4. Further, exposure is carried out sequentially, by means of an electron beam, on respective chips on the entire surface of the wafer 5. In this step, it is desirable that a repeatable pattern is formed by exposure using a cell-projection method in order to increase the throughput of the electron beam exposure.

In view of that the throughput of an electron beam exposure device 2 is normally lower than the throughput of a light stepper 1, the system is arranged so as to comprise a plurality of electron beam exposure devices 2, so that the processing performance of the stepper might not be limited by the processing performance of the electron beam device and so that wafers 5 conveyed from the stepper 1 can be subjected to parallel processing. However, since wafers flow in series in the entire system, as a whole, one resist coating/developing device is provided with respect to those exposure devices. In this manner, the high throughput of a stepper and the high resolution of electron beam exposure consist together.

If an electron beam exposure device 2 has a higher throughput than a light stepper 1, one electron beam exposure device 2 may be provided with respect to a plurality of steppers 1.

After all patterns are drawn on all chips on the entire surface of the wafer 5, the wafer 5 is returned to the coating/developing device 3 by the transport mechanism 4, and is subjected to development, to complete pattern formation. A resist which can be used for such a system is a resist (e.g., UV2HS or UVN-HS: manufactured by Shipley) of a chemical amplification type which has a high resolution and a high sensitivity.

In this type of resist, the performance is degraded by various chemical substances in air, and therefore, the transport mechanism is provided so that wafers can be dealt with under environmental control in and between various devices 1, 2, and 3. The environmental control is naturally carried out not only in view of chemical pollution but also physical pollution, temperature, humidity, and the like. As a result, changes of pattern dimensions before and after exposure can be restricted.

By constructing the lithography system as described above, it is possible to form device patterns including fine small patterns according to 0.1 μm rules with a high throughput.

Figure 3:
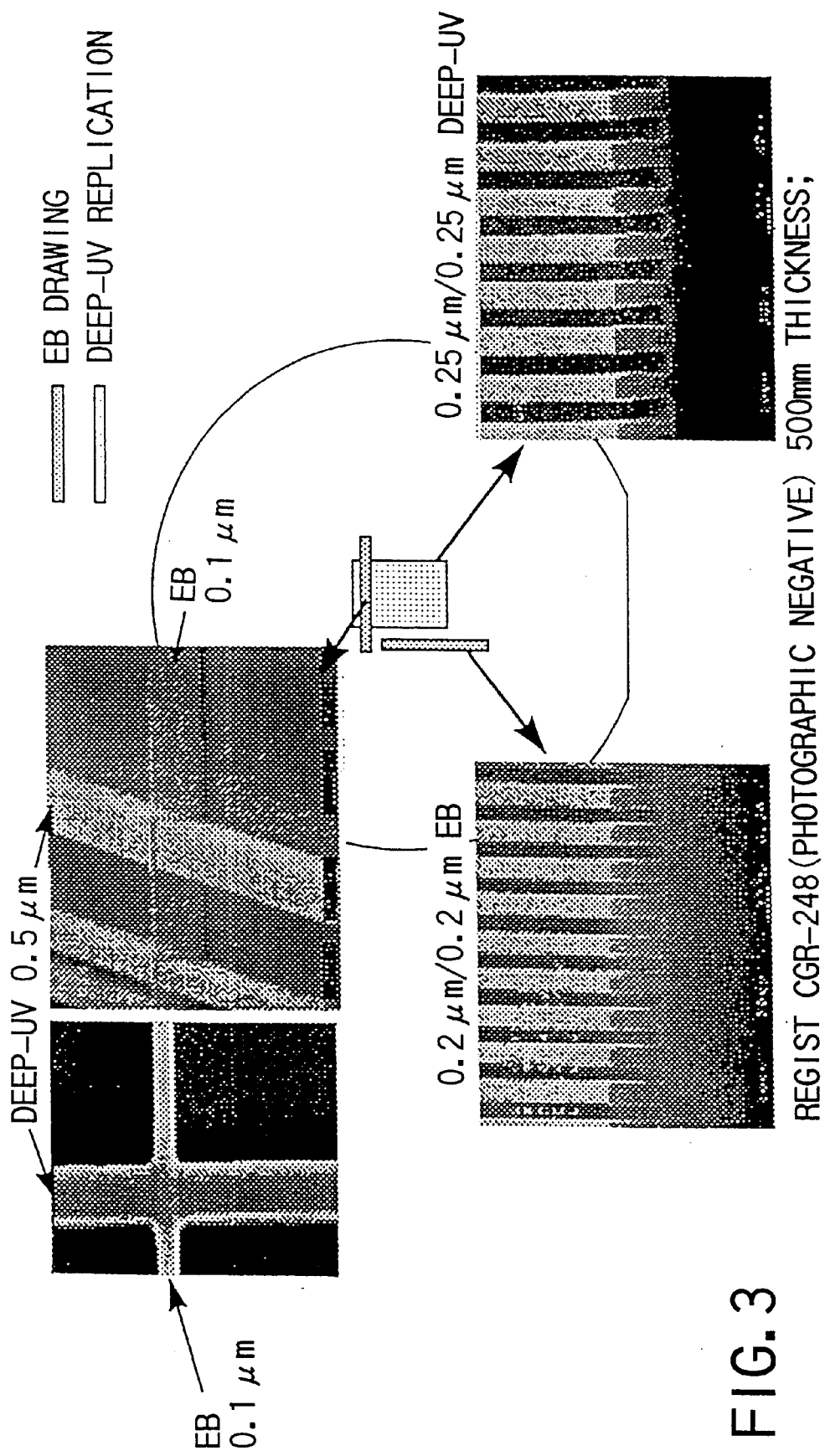
FIG. 3 shows an example of resist pattern prepared by the lithography system shown in FIG. 1.

FIG. 3 shows an example of a fine small pattern formed on a negative resist (UNV) of a chemical amplification type having a thickness of 0.5 μm with use of a lithography system. A rough pattern of 0.25 μm or larger was formed on a resist 5 by exposure using a deep-UV stepper, and a fine pattern of 0.25 μm or smaller was formed by exposure with an electron beam. With a development solution of a TNAH solution, development was carried out under condition of 0.27 rules and 60 seconds. Patterns of 0.1 μm or larger were securely formed and it was found that the lithography system has sufficient resolution performance.

The following table shows results of evaluating throughputs of the present lithography system.

TABLE 1

|  | Only EB lithography Memory cell: CP Peripheral circuit: VSB | Deep-UV/EB Intra-level Mix & Match Memory cell: CP Peripheral circuit: Deep UV |
|---|---|---|
| Evaluation sample 256 MDRAM gate layer | 0.3 wafers/hour | 2.84 wafers/hour |

CONDITION
Wafer: 8 inches
The number of chips: 100/wafer
CP-EB system: Hitachi HL-800D An exposure pattern used for evaluating the throughputs is for a gate layer of a 256M bit DRAM according to 1.15 μm rules. Throughputs are evaluated supposing that exposure patterns for 100 chips are arrayed on the entire surface of a 8-inch wafer and exposure was carried out. The sensitivity of resists is supposed to be 10 μC/cm$^2$. The evaluation is made in case of using an electron beam drawing device HL-800D manufactured by HITACH.

The performance of the device is referred to references (1) Y. Nakayama et. al., J. Vac. Sci. Technol., B8(6), 1990, p1836., (2) Y. Shoda et. al., J. Vac. Csi. Technol., B9(6), 1991, p2940, (3) H. Itho et al., J. Vac. Sci. Technol., B10(6), 1992, p2799. The evaluation adopts a structure of adopting one stepper and one electron beam exposure device.

In case of performing only electron beam exposure with use of cell-projection (five cells), the throughput is evaluated to be 0.3 wafers per hour. In contrast, in case where a rough pattern of 0.25 μm or more is exposed by a deep-UV stepper and another fine pattern is exposed to an electron beam with use of cell-projection (five cells), the throughput is evaluated to be 2.8 wafers per hour, and thus, a higher value can be attained than in the former case.

It is considered that a throughput sufficient for a production tool can be ensured if three electron beam exposure devices are provided so that wafers from a stepper are processed in parallel. A post-light-lithography production system can be realized with an excellent resolution obtained by electron beam exposure, which cannot be reached by light exposure, and with a high throughput equivalent to a light stepper.

However, in the pattern forming method and lithography system as described above, position matching (alignment) of a rough pattern in light exposure and a fine pattern in electron beam exposure is made indirectly since the position matching (alignment) must be carried out separately with reference to marks on the substrate 5. In addition, positioning of the fine pattern with respect to a concave and convex pattern (or base pattern) on the surface of the substrate 5 is made with reference to marks on the substrate, and is therefore indirect. Since the matching accuracy becomes severer and severer in accordance with downsizing of a pattern size, it will be a significant problem if layering accuracy cannot be improved by utilizing direct position matching.

In this respect, the present invention further improves layering accuracy of patterns by adopting direct matching in position matching between a rough pattern and a fine pattern in one same layer, and in position matching of a fine pattern with respect to a base pattern, which requires critical position accuracy.

Figure 4:
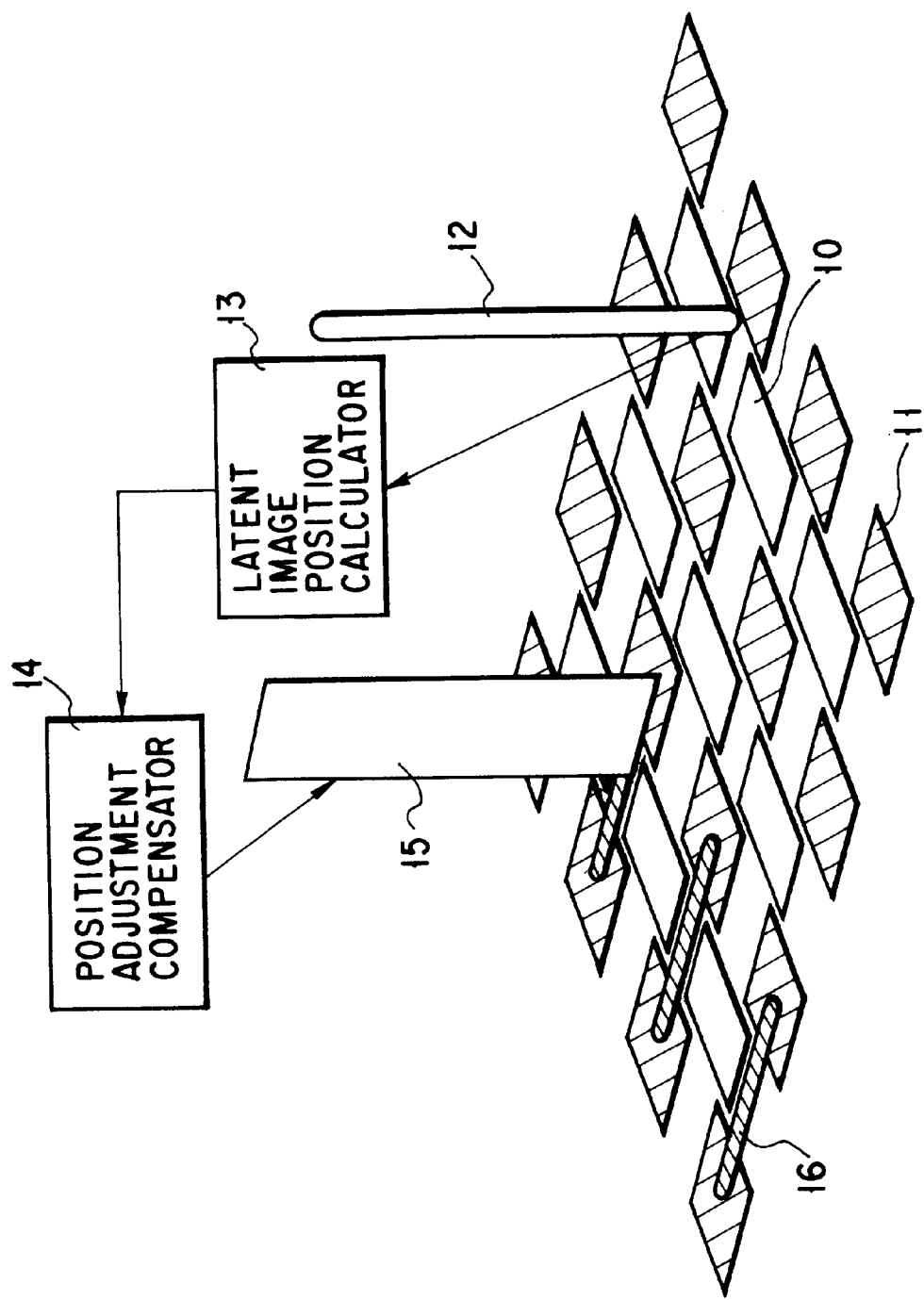
FIG. 4 is a view showing a basic structure which is necessary for positioning a fine pattern in compliance with a rough pattern and which is incorporated in the lithography system in FIG. 1.

FIG. 4 is a view for explaining the basis of a direct matching method of directly matching a rough pattern and a fine pattern in one same layer and a direct matching method of directly matching a fine pattern with respect to a base pattern. In FIG. 4, a reference 10 denotes a ground pattern of a substrate below a sensitive material, and a reference 11 denotes a latent image of a rough pattern formed in the sensitive material. A reference 12 denotes a detection beam for detecting a latent image, and a reference 13 denotes a latent image position calculator for calculating a position of a latent image. A reference 14 denotes a position adjustment compensator for controlling compensation of a pattern position during electron beam exposure by comparing the calculated position with design data, and a reference 15 denotes an electron beam for exposing a pattern. A reference 16 denotes a latent image of a fine pattern formed by an electron beam.

A detection beam and an exposure beam are arranged to be independent from each other, in order that operation using a detection beam and operation using an exposure beam can be executed in parallel during operation of a stage on which a substrate is mounted, thereby to increase the processing performance of an electron beam.

Next, explanation will be made of the direct matching method for a rough pattern and a fine pattern in one same layer and the direct matching method for a base pattern and a fine pattern.

(I) Direct matching method of directly matching a rough pattern and a fine pattern with each other in one same layer:

In a Mix and Match method using light and an electron beam in one same layer, a latent image is formed in a photosensitive material by light exposure to be performed firstly. The latent image is used as a position matching mark for electron beam exposure to be performed later, to obtain a detection signal from which a displacement (distance) of an actual exposure position of a rough pattern from a designed position is obtained. The exposure position of the fine pattern is intentionally shifted from the designed position by a distance obtained, such that the position of the fine pattern is aligned with the position of the rough pattern.

In case of using an electron beam for detecting a latent image, the total amount of an electron beam to be irradiated onto a sensitive material must be reduced to be equal to or lower than a total amount of an electron beam required for exposing the sensitive material. In case of using light for detecting a latent image, it is necessary to use light having a wavelength different from a sensible wavelength of a sensitive material.

Specifically, in case of detecting a latent image or a surface pattern by an electron beam, a sensitive material is exposed with the electron beam for detection, and therefore, energy of the electron beam must be set to a value with which only a surface layer portion of a sensitive material is exposed but a portion deeper than the surface layer portion is not exposed. After exposure, by thinning the sensitive material and removing the surface layer portion, the thinned sensitive material is developed, so that those portions which are unnecessarily exposed by irradiation of an electron beam for detecting a latent image and a surface pattern, with only rough and fine patterns kept remained.

Thus, a pattern position in electron beam exposure to be performed later is detected by using a latent image formed in a sensitive material in light exposure, as a position matching mark, and an exposure position of a fine pattern is compensated for (or intentionally shifted). As a result of this, positions of both patterns can be directly matched with each other.

(II) Direct position matching method for directly matching a fine pattern with a base pattern In the direct matching method for rough and fine pattern in one same layer, as described above, positions of both patterns can be directly matched with each other with high accuracy. However, there is a case that a fine pattern which requires critical position accuracy should preferably be matched with a pattern position in a base substrate. In this case, a latent image formed in a sensitive material by light exposure performed firstly is not used but a concave and convex pattern formed on the surface of the base substrate 5 below a sensitive material is used, i.e., a base pattern is used as a position matching mark for electron beam exposure to be performed later, and the exposure position of a fine pattern is compensated for with respect to the position of the base pattern.

In this case, the total amount of an electron beam which is irradiated through a sensitive material to detect a base pattern must be restricted to be equal to or lower than a total amount of an electron beam required for exposing the sensitive material, like in the method as described before. In case of using light for detecting a latent image, it is necessary to use light having a wavelength different from a sensible wavelength of a sensitive material.

Thus, a position of a fine pattern in electron beam exposure to be performed later is compensated for by using a base pattern below a sensitive material, as a position matching mark, and as a result, positions of both patterns in one same layer can be directly matched with each other with high accuracy.

Next, explanation will be made of a specific structure of an electron beam exposure device used in a Mix and Match lithography system in one same layer.

FIG. 5 is a view showing a structure of an electron beam exposure device adopted in the present invention. An electron beam 102 emitted from an electron gun 101 is shaped into a desired size and shape by a condenser lens 103 and is focused on a sample 105 by an objective lens 104. An objective deflector 106 for controlling a drawing position on the surface of a sample is provided in the objective lens 104, and the electron beam is deflected at a high speed. The sample 105 is set on a stage 107 and is controlled and moved together with an adjuster mark table 108 and a Faraday cup 109.

Between the sample 105 and the objective lens 104, a detector 119 for detecting a signal is provided and detects a signal from the surface of the sample. The stage position is monitored by a laser interferometer 110. Further, the stage 107 is insulated from the ground and is arranged so as to be applied with a negative voltage 111 by a retarding voltage apply means. In this manner, an electron beam injected onto the sample is decelerated so as to obtain desired energy. Although the beam position on the sample surface is changed by turning on/off the retarding voltage 111, a mark table is previously used to measure a positional displacement and calibration is thus previously obtained.

Exposure is performed by moving the stage 107, by deflecting a beam by means of the objective deflector 106, and by setting a drawing position. Meanwhile, observation of a latent image is previously carried out. Before exposure, a sample is applied with a retarding voltage 111 and a desired electron beam is irradiated under desired beam conditions, to measure the position of a latent image formed by light exposure. The position of an exposure pattern corrected on the basis of latent image position information thus obtained is decided by the objective deflector 106 and exposure is carried out, in electron beam exposure of a pattern.

Figure 6:
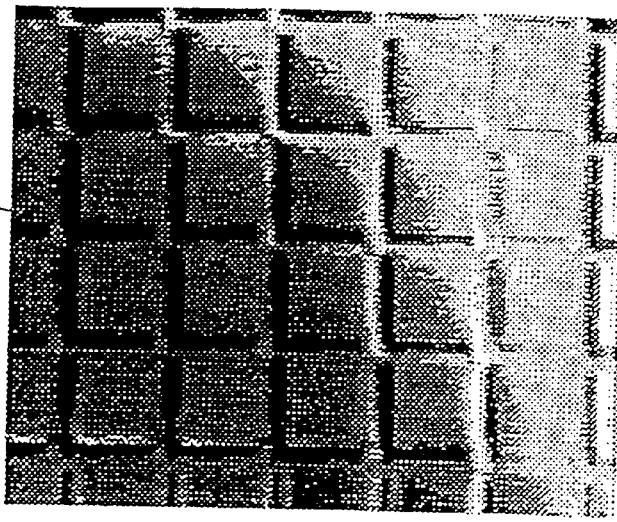
FIG. 6 is a view showing an example of a latent image of a rough pattern.

FIG. 6 shows an example of a latent image in a sensitive material exposed with light, observed in the electron beam exposure device as described above. In the figure, those portions each of which looks like a figure L are portions (or latent images) which are exposed with light. In this case, a resist under observation is not at all subjected to development processing or the like, and the resist surface does not include any concave or convex portions, but the contrast appears only due to a difference depending on whether the resist is exposed or unexposed. The observation was carried out under condition that energy of an entering electron beam was 1850 eV. In addition, secondary electrons were used to detect a signal and the total amount of an electron beam irradiated on a sensitive material for the detection was equal to or less than the total amount of an exposing electron beam.

The mechanism in which an observed latent image appears in a resist will now be explained. FIG. 7 is a view which explains the mechanism. In case of irradiating an electron beam onto a resist 304, the generating efficiency of secondary electrons differs due to a difference between acceleration voltages of electron beams irradiated, as shown in FIG. 8, and the surface of the resist 304 as an insulating material is charged up positively or negatively. In case where a latent image observation was carried out with an acceleration voltage set to 2 kV, the resistance value of a portion 306 exposed with light decreased, as shown in FIG. 8. Electric charges charged on the resist surface moved to the substrate through the portion of the resist where the resistance value was low, and thereafter flowed to the ground. Meanwhile, an unexposed portion 305 had a high resistance value and less electric charges tends to move, so that the resist surface was charged up negatively.

Thus, the condition of charging up the resist surface differs between the exposed portion 306 and the unexposed portion 305, and a potential difference on the resist surface is observed as the contrast of a SEM image, so that a latent image is visualized. The contrast appears such that a portion charged negatively appears in white while a portion having a higher potential than the portion appearing in white appears in black and is observed as a latent image.

Next, explanation will be made of a method of obtaining a position of a latent image, with use of a latent image detection method as described below. In FIG. 5, position information concerning the stage 107 is monitored with high accuracy by the laser interferometer 110. As for a deflection area of the objective deflector for controlling the position on a sample surface, the deflection sensitivity (or the size of a deflection position) and the direction thereof are subjected together to calibration with use of a mark table 108 previously installed on the stage 107. Specifically, the position of a mark can be known from a relationship between stage coordinates and a mark detection position in the deflection area of the objective deflector.

Likewise, as shown in FIG. 9, an L-shaped image 120 is observed and the stage position (X1, Y1) is moved to the position which is considered as the position of a designed L-shaped latent image. At the stage position, the objective deflector 106 is driven to detect accurately the position of the latent image. Supposing that the center of gravity of the latent image 120 in the deflection area of the objective deflector 106 is (X2,Y2), the position of the L-shaped latent image 120 on the sample is obtained by (X=X1+X2, Y=Y1+Y2). Based on the position information (X,Y), the position matching of patterns in electron beam exposure is carried out. Since the same objective deflector is used for latent image observation and for beam position control in drawing, drawing is performed such that the position information and the drawing position are equal to each other.

Thus, since a latent image obtained by light exposure is detected by an electron beam and is directly used as a mark for electron beam exposure, a rough pattern and a fine pattern are directly layered and matched, without including an error of a mark position and an error in mark detection. As a result, it is possible to achieve pattern forming of both patterns in one same layer, with very high positional accuracy.

Next, explanation will be made of a method of directly matching a position of a fine pattern with respect to a base pattern below a sensitive material. The electron beam exposure device used is the same as that shown in FIG. 5.

The exposure is performed by moving the stage 107 to a set position, by deflecting a beam by the objective deflector 106, and by setting a drawing position. Meanwhile, observation of a base pattern is previously performed. Before exposure, a retarding voltage 111 is applied to the sample, and an electron beam is irradiated under desired electron beam conditions, to measure the position of a base pattern. In electron beam exposure of a pattern, the position of an exposure pattern corrected on the basis of the base pattern information is decided by the objective deflector 106, and exposure is performed.

Figure 10:
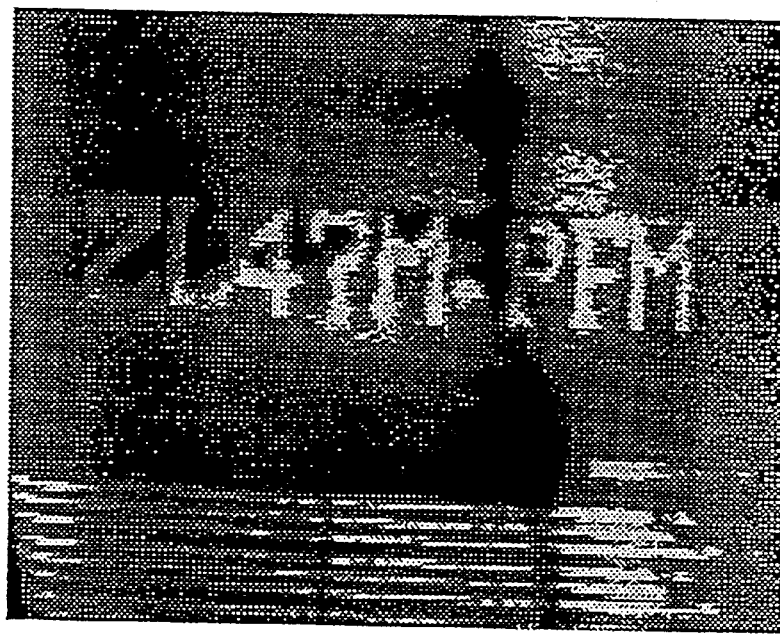
FIG. 10 is a view showing an example of a base pattern.

FIG. 10 shows an example of an observed base pattern in the electron exposure device as described above. In the figure, a portion appearing in white is a portion of a base pattern 121. In this case, the resist surface does not include a concave or convex portion caused by the base pattern 121, and the base pattern 121 is observed from a flat resist surface. The observation was carried out under a beam condition that energy of an irradiated electron beam was 1850 eV. The figure shows an example in which a character mark of a base pattern 121 formed below a resist film and a silicon oxide film was detected. Secondary electrons are used to detect a signal, and the total amount of an electron beam irradiated onto a sensitive material for detection was equal to or less that the total amount of an exposure electron beam.

Explanation will now be made of a mechanism in which a base patter of a substrate is observed through a resist. FIG. 11 is a view for explaining the mechanism. In case where a low-accelerated electron beam 404 is irradiated onto a resist 405, electrons escapes from the resist surface through the resist into the substrate, depending on the resistance value and the electrostatic capacity of the resist. However, if the surface shape of the base substrate 406 varies as shown in FIG. 11, the film thickness of the resist varies depending on the shape of the substrate below the resist. Since the thickness of the resist thus varies, the resistance value and the electrostatic capacity of the resist also varies depending on the shape of the substrate. When such a surface of the resist is observed with use of a 2 kV-acceleration-voltage electron beam, the resist surface is constantly electrified and the voltage thereof varies depending on the resistance value and electrostatic capacity of the resist which depends on the shape of the base substrate.

Such variances of potentials on the resist surface are observed as the contrast of a SEM image, such that a portion which is charged more negatively as a base pattern of a substrate appears in white while a portion having a potential higher than the portion as the base patter appears in black. Thus, a base pattern of a substrate is observed. Therefore, a base pattern below a resist can be observed by charging up the resist surface, and the base pattern of the substrate is used as a position matching mark to detect the position thereof. Position correction of a fine pattern is carried on the basis of position information thus obtained, so that patterns can be formed with high layering and matching accuracy.

Next, explanation will be made of a method of obtaining a position of a pattern with use of the base pattern detection method as described above. Position information of the stage 107 is monitored by the laser interferometer 110 with high accuracy. As for a deflection area of the objective deflector 106 for controlling the position on a sample surface, the deflection sensitivity, the size of a position, and the direction thereof are subjected together to calibration with use of the mark table 108 previously installed on the stage 107. Specifically, the position of a mark can be known from a relationship between the coordinates of the stage and a mark detection position in the deflection area of the objective deflector.

Likewise, as explained with reference to FIG. 9, a base pattern 121 is observed and the stage position is moved by (X1,Y1) to a designed position of the base pattern 121. At the stage position, the objective deflector 106 is driven so that the position of the base pattern 121 can be accurately. Supposing that the center of gravity of the base pattern 121 in the deflection area of the objective deflector 106 is (X3,Y3), the position of the base pattern 121 on the sample is obtained by (X=X1+X3,Y=Y1+Y3). Based on the position information (X,Y), the position matching of patterns in electron beam exposure is carried out. Since the same objective deflector is used for observing the base pattern and for beam position control in drawing, drawing is performed such that the position information of the base pattern 121 and the drawing position are equal to each other.

Thus, since a base pattern 121 is detected by an electron beam and is directly used as a mark for electron beam exposure, the base pattern and a fine pattern are directly layered and matched, without including an error of a mark position and an error in light mark detection. As a result, it is possible to achieve pattern forming of patterns with very high positional accuracy.

Next, explanation will be made of a latent image observation in case of forming an exposure pattern with use of a fact that the electrostatic capacity of a resist used after exposure changes from that before exposure.

Figure 12A:
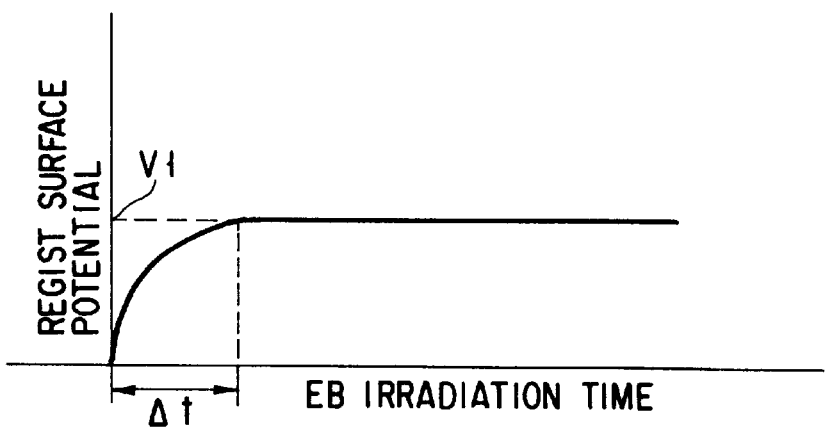
FIGS. 12A and 12B are graphs each showing a dependency of a resist surface potential on an electron beam irradiation time.
Figure 12B:
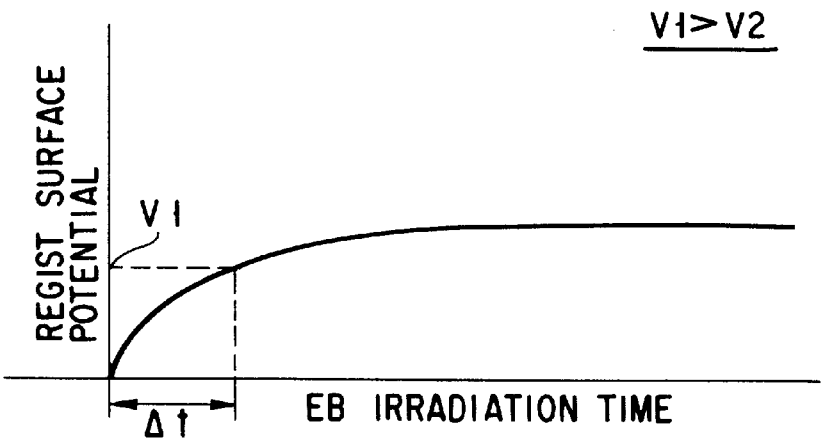
Figure 12C:
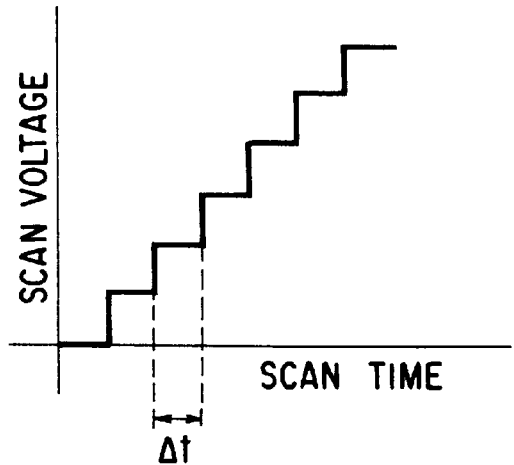
FIG. 12C is a graph showing a scan voltage and a scan time.

The following explanation will be made with respect to an example in which the electrostatic capacity of an exposed area increases. FIG. 12A shows how the voltage at a resist surface which is not exposed is changed by an electron beam. Scanning by means of a scanning type electron microscope or the like is carried out in a stepped manner as shown in FIG. 12. If an electron beam stops for a certain time period Δt at a certain point (in an unexposed area), the surface potential then changes as shown in FIG. 12A and the potential is increased to V1 after Δt. Meanwhile, if an electron beam stops for a certain time period Δt at a certain point (in an exposed area) as shown in FIG. 2C after the electrostatic capacity of a resist is once changed by exposure, the surface potential then changes as shown in FIG. 12B and the potential is increased to V2 after Δt.

Thus, the potential V2 in case of a resist once exposed differs from the potential v1 in case of a resist not exposed. In other words, the potential of the resist surface differs between a exposed resist and an unexposed resist, so that a latent image can be detected by observing the potential difference is observed in form of contrast.

Thus, by forming a pattern with use of a characteristic that the electrostatic capacity after exposure changes from that before exposure, a latent image in a resist can be observed with respect to information of exposure in the resist without developing the resist. The latent image is used as a position matching mark in a later step, to detect the position thereof, and a position correction is carried out based on the position information thus obtained. In this manner, by detecting information concerning exposure in a preceding step, patterns of a next step and a preceding step can be directly matched with each other, so that a device can be prepared with high accuracy.

Next, a relationship between a film thickness of a resist and an observation electron beam will be described below with respect to observation of a latent image or a base pattern in case of forming an exposure pattern with use of a characteristic that the resistance value and the electrostatic capacity of a resist after exposure changes from those before exposure.

A latent image can be observed on the basis of the characteristic that the resistance value and electrostatic capacity differs between an exposed portion and an unexposed portion. In this respect, there is a case that a resist is undesirably exposed during observation of a latent image due to a S/N ratio of a detection signal. If exposure reaches the inside of a resist, a resist under measurement is exposed during observation of a latent image, so that no difference appears in the resistance value and the electrostatic capacity between exposed and unexposed portions and the potential of the resist surface are kept constant. In this case, it is impossible to observe a latent image.

Figure 13:
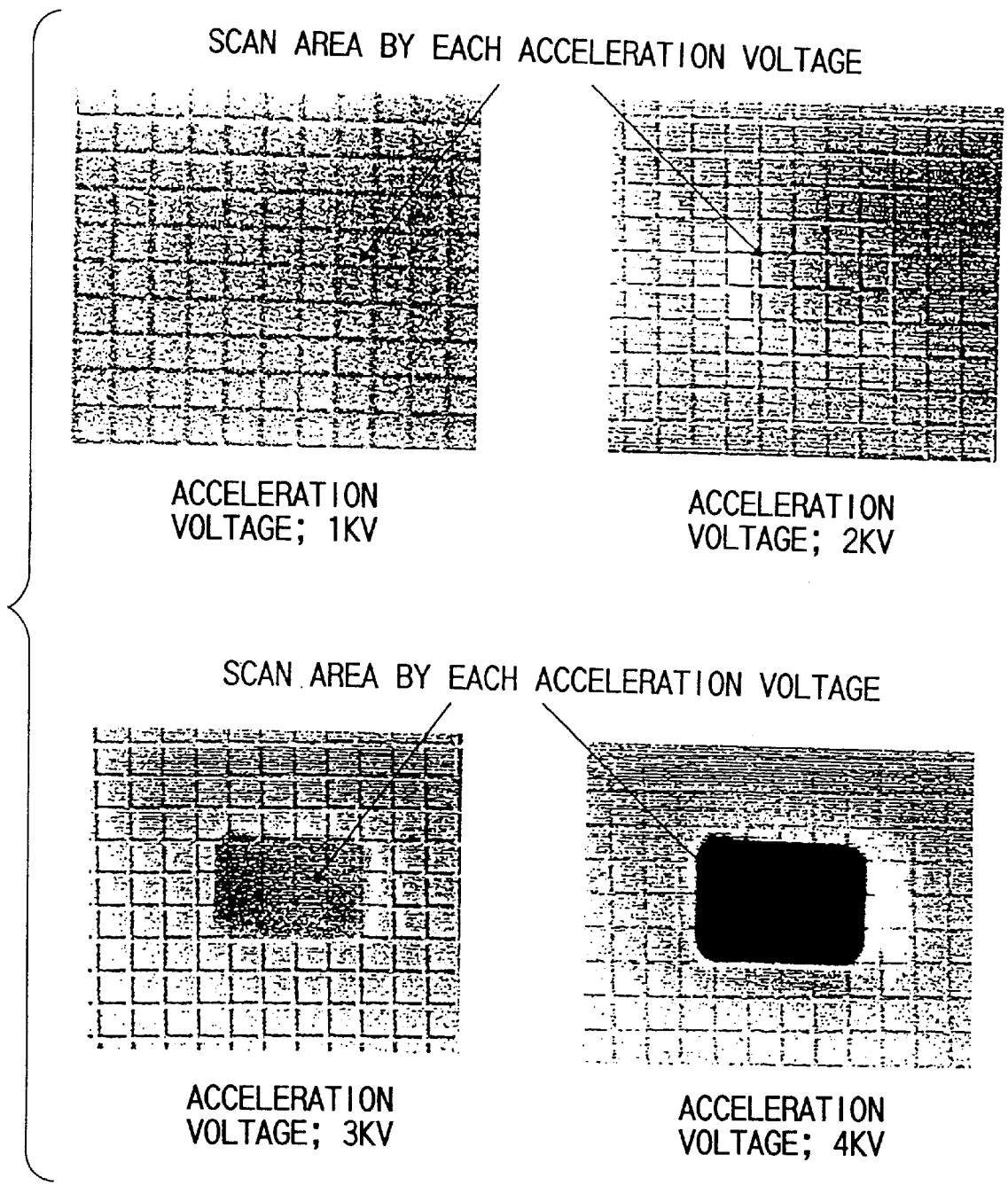
FIG. 13 shows a dependency of appearances of latent images on an exposure beam acceleration voltage.

FIG. 13 shows microscopic photographs by a SEM (Scanning type Electron Microscope) showing results where latent image observation was carried out with an acceleration voltage of 2 kV after a certain area was scanned with different beam acceleration voltages of 1 kV, 2 kV, 3 kV, and 4 kV with respect to a resist having a film thickness of 500 nm. As shown in the figure, the inside of a resist is exposed if the resist surface is observed with an acceleration voltage of 4 kV or more for a long time, and the exposed area is observed as appearing in black, so that a latent image in the exposure area cannot be observed.

Hence, it is known that an electron beam used for latent image observation must have lower energy than an electron beam used for forming a pattern, and the film thickness of a resist must be greater than the flying distance which an electron beam used for latent image observation reaches in a resist. If these conditions are not satisfied, stable latent image observation cannot be achieved. In addition, a high-accelerated electron beam for forming a pattern sufficiently penetrates through the resist and forms a pattern.

By satisfying the conditions as described above, a latent image can be observed with respect to information concerning exposure in a resist, without developing the resist, and the latent image is used as a position matching mark in a later step, to detect the position. Based on the position information, position correction of a fine pattern is carried out. In this manner, patterns of a next step and a preceding step can be directly matched with each other by detecting information concerning exposure in a preceding step, so that a device can be formed with high accuracy.

Next, a relationship with respect to an acceleration voltage of an observation electron beam will be described in observation of a latent image or a resist base pattern, in case where exposure is carried out with use of a substance with which the resistance value and the electrostatic capacity of a resist after exposure changes from those before exposure.

Figure 14:
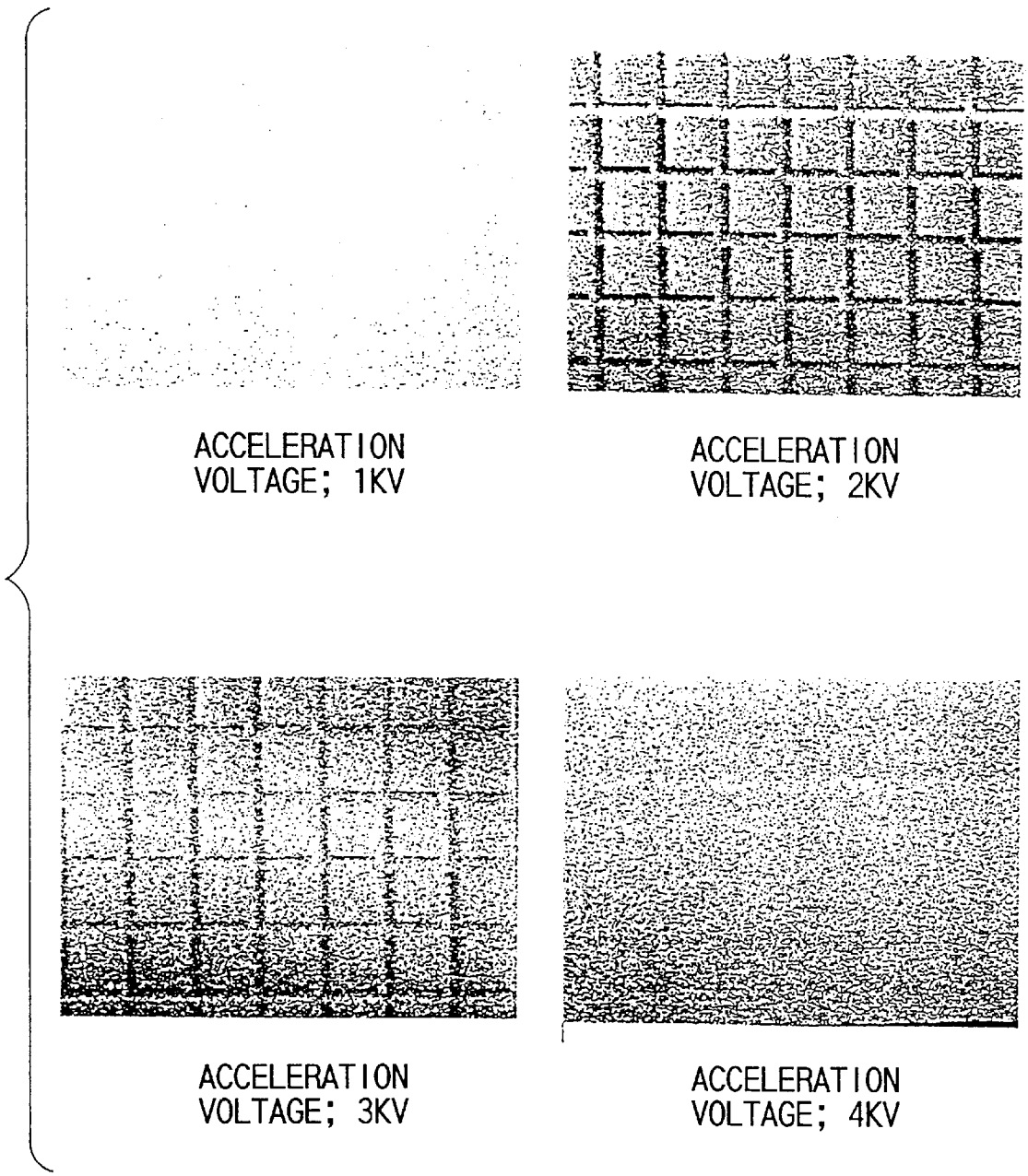
FIG. 14 shows a dependency of appearances of latent images on an observation beam acceleration voltage.

A latent image can be observed with use of the characteristic that the resistance value and the electrostatic capacity differ between exposed and unexposed portions and by charging up the resist surface. However, as shown in FIG. 14, the observed condition changes depending on the beam acceleration voltage during latent image observation. This is because the charging condition on the surface of an insulating material changes in accordance with an acceleration voltage when an electron beam is irradiated on an insulating material, and a latent image cannot be observed with an acceleration voltage of 1 kV under the conditions of the embodiment described above.

When the surface of an insulating material is charged negatively, a latent image can be observed as shown in a model in FIG. 7. Meanwhile, when the surface is charged positively, an electric field 508 is generated between the surface of a resist 504 and the substrate, by charging-up, and positive charges 503 flow through the resist 504 due to the influence from the electric field, as shown in FIG. 15, so that the resist surface cannot be charged positively. Therefore, it is not possible to create an apparent difference between an exposed portion 506 of the resist 504 and an unexposed portion 507 thereof, and no latent image can be observed. Hence, it is found that a latent image can be observed when the surface of a resist is charged up negatively with use of an electron beam with an acceleration voltage which is higher than V2 and is lower than V1, shown in FIG. 8.

By satisfying the conditions as described above, a latent image can be observed with respect to information concerning exposure in a resist, without developing the resist, and the latent image is used as a position matching mark in a later step, to detect the position. Based on the position information, position correction of a fine pattern is carried out. In this manner, patterns of a next step and a preceding step can be directly matched with each other by detecting information concerning exposure in a preceding step, so that a device can be formed with high accuracy.

Figure 16:
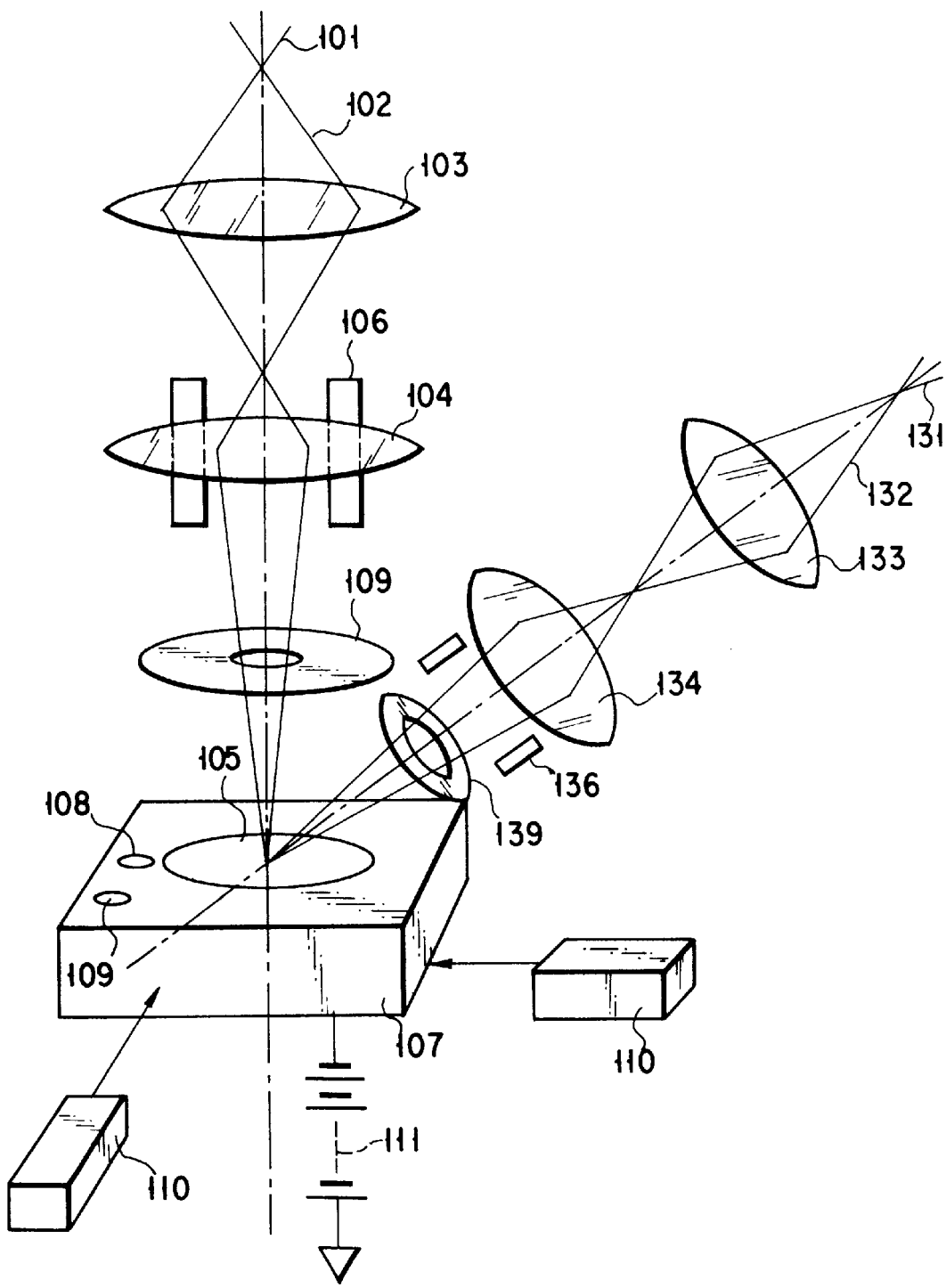
FIG. 16 is a view showing a structure of an electron beam exposure device having two optical systems, one being for fine pattern exposure and the other being for detecting a latent image.

FIG. 16 is a view showing a specific structure of another electron beam exposure device used in a Mix and Match lithography system for matching in one same layer. The following embodiment will be explained with respect to an example of direct matching using a latent image, and explanation of an example using a base pattern will be omitted herefrom.

An electron beam 102 emitted from an electron gun 101 is shaped into a desired size and shape by a condenser lens 103 and is focused on a sample 105 by an objective lens 104. An objective deflector 106 for controlling a drawing position on the surface of a sample is provided in the objective lens 104, and the electron beam is deflected at a high speed. The sample 105 is set on a stage 107 and is controlled and moved together with an adjuster mark table 108 and a Faraday cup 109. Between the sample 105 and the objective lens 104, a detector 119 for detecting a signal is provided and detects a signal from the surface of the sample.

Meanwhile, an electron beam 132 emitted from a low-accelerated electron gun 131 for latent image observation is shaped into desired size and shape by an irradiation lens 133 and is focused on the sample 105 by an objective lens 134. Simultaneously, the electron beam is deflected so as to scan the surface of the sample 105 by an objective deflector 136 provided in the objective lens 134, and a latent image is obtained by a latent image observation detector 139.

Position information of the stage 107 is monitored by a laser interferometer 110 with high accuracy. Further, as for the objective deflector for controlling a drawing position on the sample surface by means of an electron beam, the drawing position is previously subjected to calibration with use of a mark table 108 previously set on the stage 107.

Figure 17A:
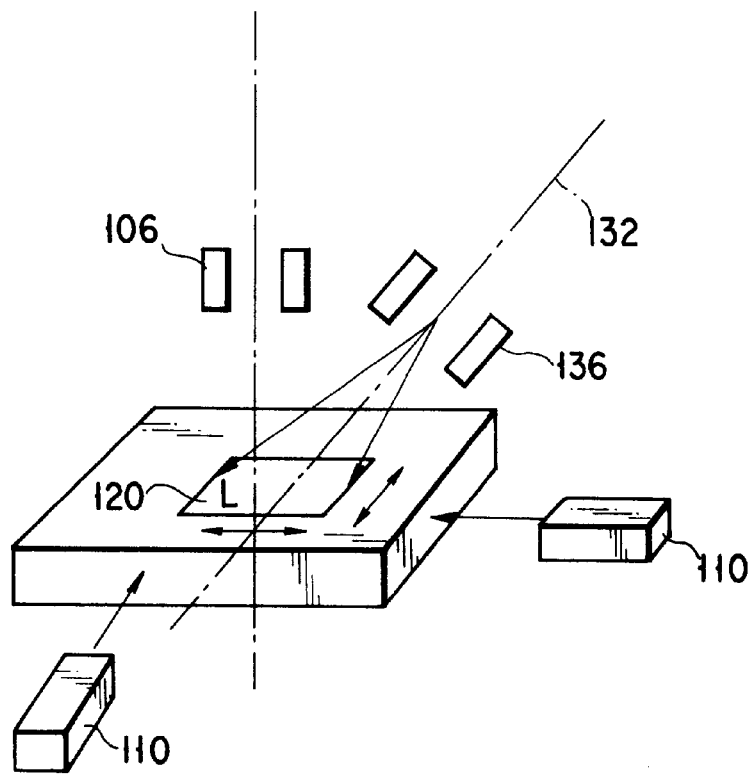
FIG. 17A is a view showing a state of detecting a latent image by means of the device shown in FIG. 16.
Figure 17B:
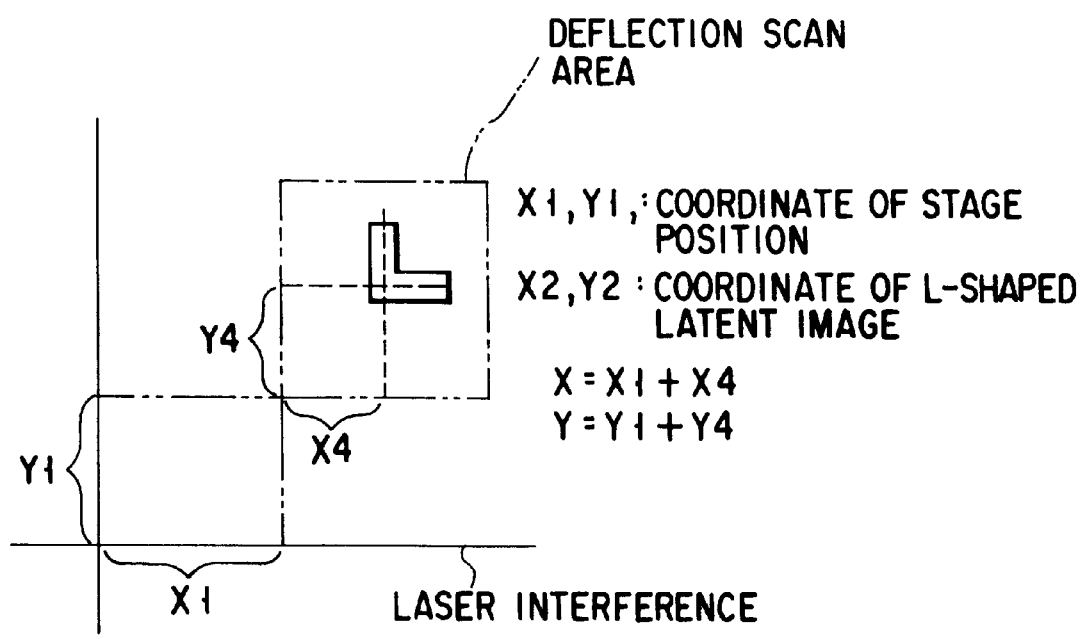
FIG. 17B is a schematic view for explaining a method of obtaining a position of a latent image detected as shown in FIG. 17A.

Specifically, relative positions of the objective deflector 106 for drawing and the deflector 136 for latent image detection are obtained. For example, an L-shaped latent image 120 is observed by a low-accelerated electron beam 132, as shown in FIGS. 17A and 17B. Where the stage position of the L-shaped latent image 120 is (X1,Y1), the center of gravity of the L-shaped latent image 120 is accurately obtained at the stage position by means of deflection with use of a low-accelerated beam 118, and then, the position of the center of gravity is (X4,Y4). The position of the L-shaped latent image on the stage with use of a low-accelerated electron beam system can be obtained by (X=X1+X4,Y=Y1+Y4).

From the position information (X,Y) and a relative positional relationship between the deflector 106 for drawing and the latent image observation deflector 136, data concerning a pattern position in a next step is inputted to the objective deflector 106, position control and drawing are carried out, and position matching with the drawing position in a preceding step is carried out. No problem will be caused if the deflector 136 for latent image observation used in this procedure is either an electrostatic type or an electromagnetic type. However, higher reproductivity of position accuracy can be obtained with an electrostatic type one.

Since a latent image formed by light exposure is detected by an electron beam and is directly used as a mark for an electron beam, a rough pattern and a fine pattern are directly layered without including an error of a mark position or a light mark detection error, and as a result, both patterns can be formed in one same layer with high position accuracy.

In an electron beam exposure device constructed in a structure as described above, the value of energy of a low-accelerated electron beam entering into a sample 105, which is optimum for latent image observation, varies depending on the material of a resist and a film thickness thereof.

Figure 18:
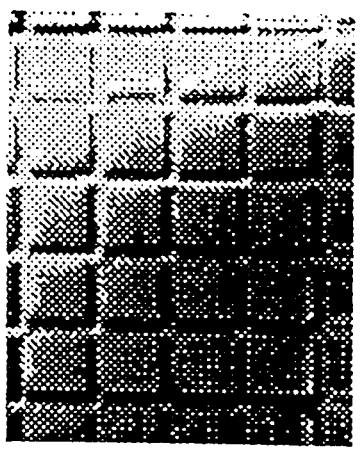
FIG. 18 shows a dependency of appearances of latent images on energy of electron beams for detecting a latent image.
Figure 18:
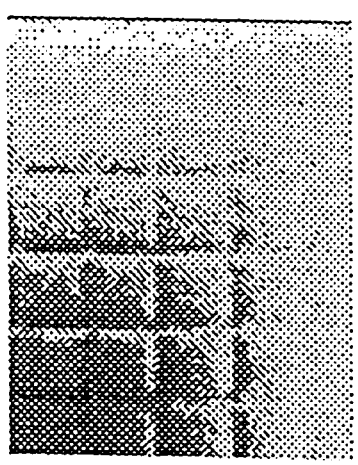
Figure 18:
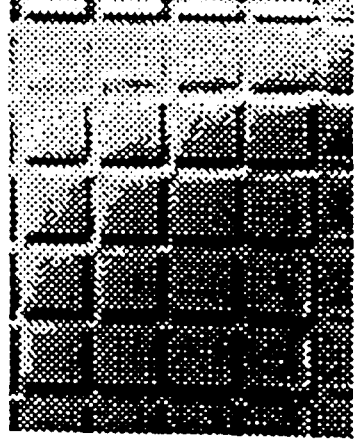

FIG. 18 shows an example of an optimum value and shows observation examples where same wafers are observed with different values of energy of the entering electron beam. When the energy of an entering electron beam is set to 1850V, L-shaped latent images 120 can be clearly observed. When the energy of an entering electron beam is then set to 800V, the clearness of L-shaped latent images 120 is deteriorated. When the energy of an entering electron beam is returned again to 1850V, L-shaped latent images can be observed clearly.

When the left and central photographs of FIG. 18 are compared with each other, changes in clearness of information concerning L-shaped latent images 120 can be observed apparently. By clearly observing L-shaped latent images 120, position information can be observed with a high S/N ratio. Changes of the energy of an entering electron beam entering into the sample are obtained by changing the voltage applied to a sample with the acceleration voltage of the electron gun section 131 kept constant. The energy of an low-accelerated electron beam 132 entering into the sample 105 for observation of a latent image may be changed by changing the acceleration voltage for an electron beam in the electron gun section. The same effect can be obtained by changing the retarding voltage 111.

By setting an acceleration voltage optimal for observation of a latent image, depending on the material and film thickness of a resist, a latent image formed in a resist by light exposure in a preceding step can be clearly detected by an electron beam. As the image quality, i.e., the S/N ratio is improved, the position detection accuracy of a latent image pattern is improved and rough and fine patterns can be directly layered with higher accuracy. As a result, pattern forming in one same layer can be achieved with very high accuracy.

Figure 19:
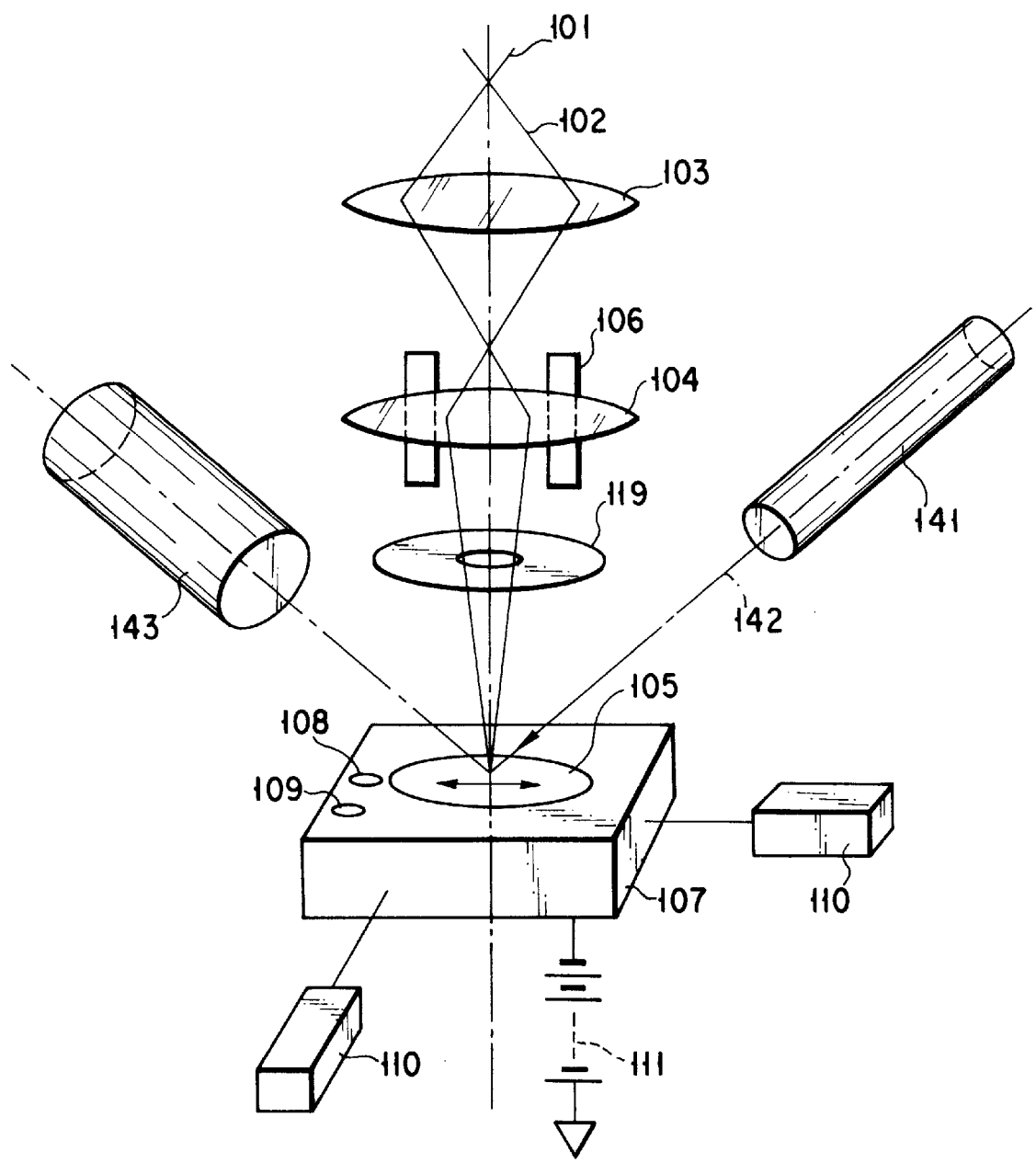
FIG. 19 is a view showing a structure of an electron beam exposure device incorporated in a laser microscope.

FIG. 19 is a view showing a specific structure of another electron beam exposure device used in a Mix and Match lithography system for matching in one same layer. The following embodiment will be explained with respect to an example of direct matching using a latent image, and explanation of an example using a base pattern will be omitted herefrom.

An optical system used for pattern exposure is basically the same as that shown in FIG. 5. In the present embodiment, a laser microscope using a He—Ne laser 141 as a light source is incorporated for observing a latent image. A latent image obtained by light exposure is scanned with a laser beam 142 emitted from the microscope, and a reflection light therefrom is detected by a detector 143, so that a latent image is obtained. Position information of a stage 107 is monitored by a laser interferometer 110 with high accuracy. Further, the position of an image obtained by the laser microscope is previously subjected to calibration with respect to the laser interferometer by using a mark table 108.

Figure 20A:
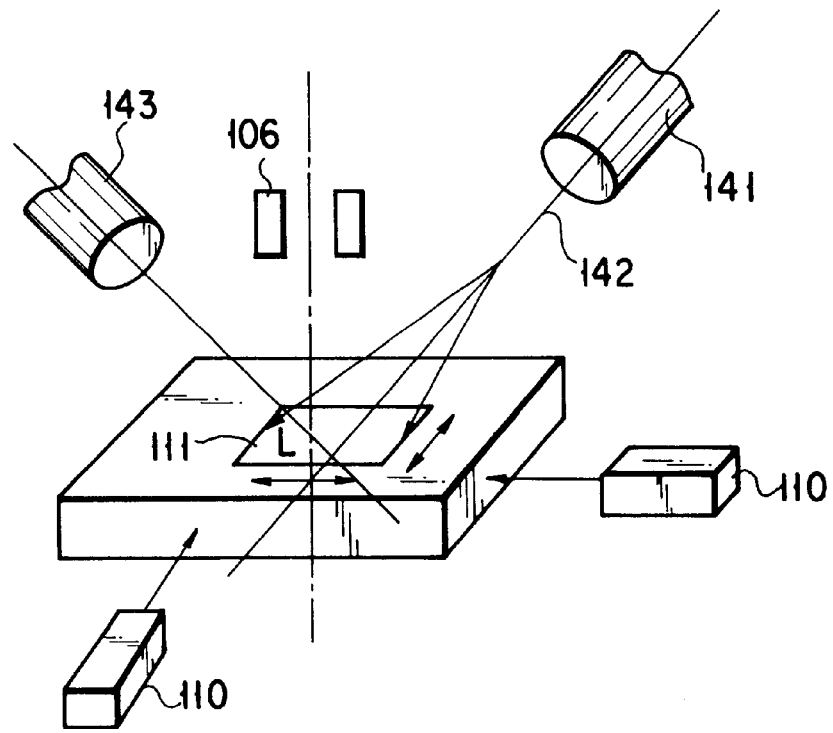
FIG. 20A is a view showing a state of detecting a latent image by means of the device shown in FIG. 19.
Figure 20B:
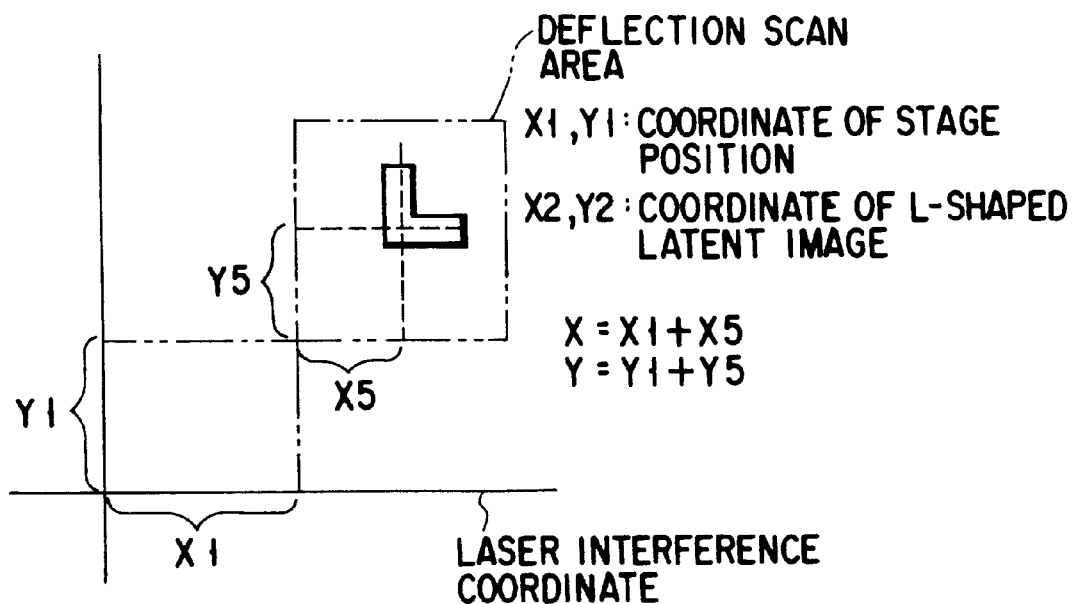
FIG. 20B is a schematic view for explaining a method of obtaining a position of a latent image detected as shown in FIG. 20A.

For example, as shown in FIGS. 20A and 20B, an L-shaped image 120 is observed by the laser microscope. Where the stage position of the L-shaped latent image 120 is (X1,Y1), the center of gravity of the L-shaped latent image 120 in a scan area is accurately obtained by scanning with use of a laser beam 142, at the stage position, and then, the center of gravity is (X5,Y5). The position of the L-shaped latent image on the sample 105 according to the laser microscope can be obtained by (X=X1+X5,Y=Y1+Y5). From the position information (X,Y) and the relative position relationship between a deflector 106 for drawing and the laser microscope, data concerning a pattern position in a next step is inputted, position control and drawing are carried out, and position matching with a drawing position in a preceding step is carried out.

Thus, it is possible to provide a post-lithography mass-production system which achieves both a higher resolution of electron beam exposure than light exposure and a throughput equivalent to that of a light stepper.

Figure 21:
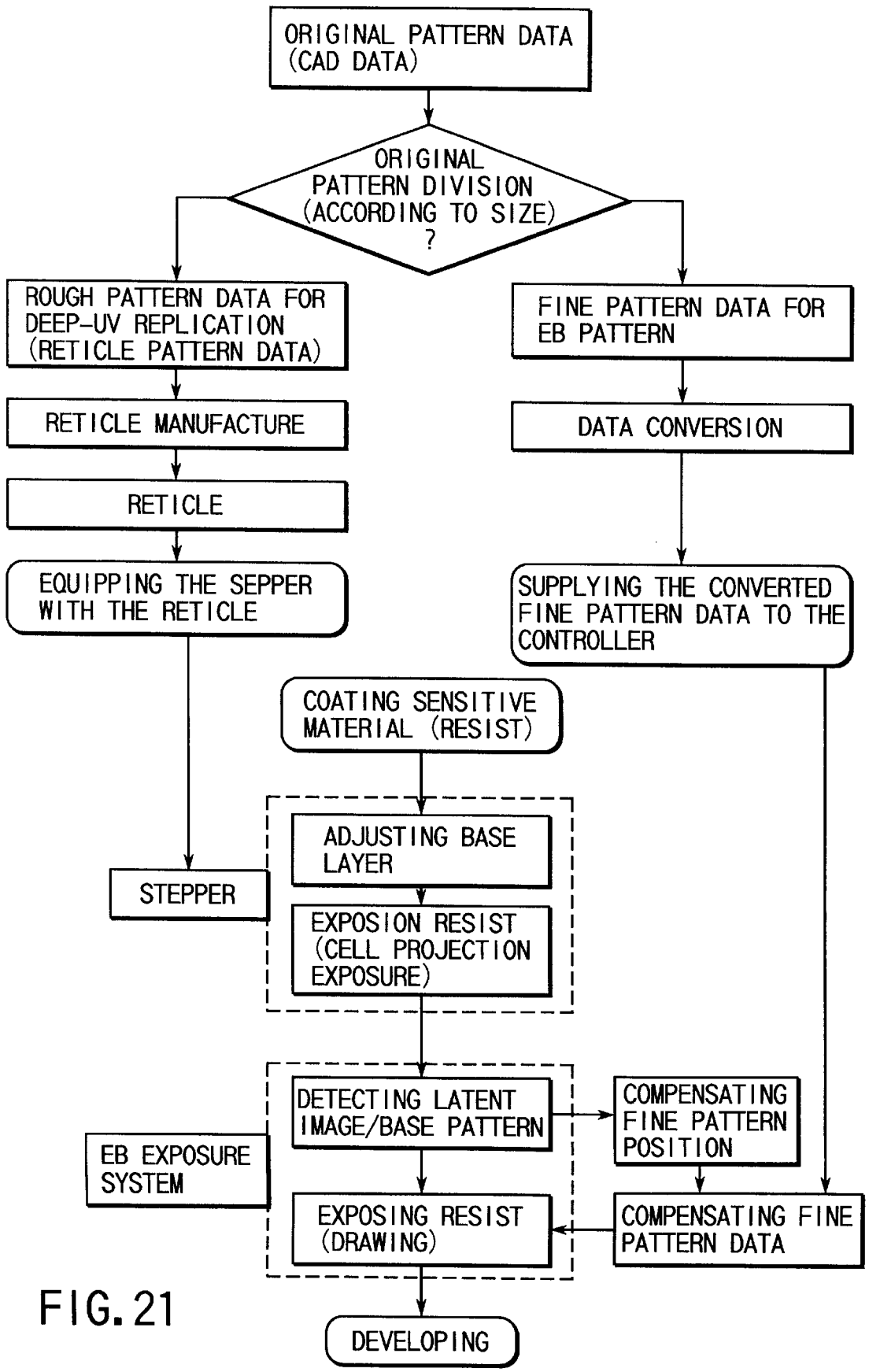
FIG. 21 is a chart showing a processing flow for aligning the position of a fine pattern with a rough pattern.

FIG. 21 shows a processing flow for practicing a Mix and Match lithography system with use of a direct matching method according to the present invention.

Device pattern CAD data is divided into reticle CAD data for light exposure and CAD data for electron beam exposure, on the basis of a resolution size value (which will be hereinafter referred to as a boundary size value) lower than the limit resolution of a light stepper used in a lithography system.

The reticle CAD data is sent to a normal reticle preparation process and a reticle is formed. A reticle thus prepared is set in a light stepper and is used to perform batch-transfer of patterns which are larger than the boundary size value. Meanwhile, CAD data for electron beam exposure is subjected to data-conversion so that the data can be used by an electron beam exposure device.

(I) In case of using an electron beam exposure device shown in FIG. 5:

A wafer subjected to batch-exposure by a light stepper is set in an electron beam exposure device, and then, energy of an electron beam is adjusted to a value suitable for latent image detection and base pattern detection. At first, the wafer is sequentially moved so as to irradiate an electron beam over the entire surface of the wafer, and an accurate position of a latent image is obtained. The value of the position is compared with pattern design data, and the position of a pattern to be formed by electron beam exposure is corrected to be an optimum value by making a correction on the design data. Thereafter, the wafer is sequentially moved again, and a pattern which cannot be resolved by light exposure is formed by an electron beam. After completion of formation of all patterns, the wafer is sent to a developing device and is subjected to development, thereby to obtain a desired resist mask.

(II) In case of using an electron beam exposure device shown in FIG. 16 or 19:

A wafer subjected to batch-exposure by a light stepper is set in an electron beam exposure device, and then, energy of an electron beam is adjusted to a value suitable for latent image detection and base pattern detection. In this device, position detection of a latent image and exposure of a fine pattern are substantially carried out in parallel. An electron beam for exposure and a detection beam for latent-image/base-pattern detection are arranged to be adjacent to each other, and therefore, a detection beam is firstly irradiated onto the wafer after sequential movement of the wafer starts. For example, detection of latent images or base patterns for one frame is started, and how much they are displaced from design values is accurately obtained. At the same time when detection for a next frame is started, exposure for the previous frame which has been subjected to detection is started in parallel with use of data in which the pattern position for electron beam exposure is corrected optimally on the basis of data concerning a displacement as described above.

By repeating the above procedure, patterns which cannot be resolved by light exposure are formed on the entire surface of the wafer by an electron beam. Upon completion of formation of all patterns, the wafer is supplied to a developing device and subjected to development, thereby to obtain a desired resist pattern.

Thus, according to this embodiment of the present invention, a pattern of a resolution lower than the limit resolution of a light stepper is dealt with by light exposure while a fine pattern of a resolution higher than the limit resolution is dealt with by electron beam exposure, and matching both patterns as well as matching of a fine pattern and a base pattern are carried out by direct matching. As a result, light exposure responds to formation of a pattern of a lower resolution than the limit resolution, thereby resulting in simplified preparation of reticles and a widened exposure process margin, while electron beam exposure responds only to formation of a pattern smaller than the boundary size value, thereby resulting in a merit that the exposure time period is greatly shortened. Therefore, the entire lithography system realizes a mass-production system which simultaneously achieves excellent resolution performance of electron beam exposure exceeding that of light exposure, a high throughput equivalent to that of a light stepper, and ultra-high-accurate matching due to direct matching.

Figure 22A:
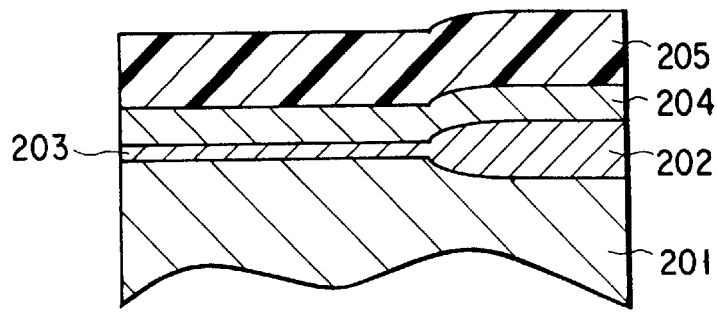
FIG. 22A is a cross-section of a semiconductor device prepared by a lithography method according to the present invention.
Figure 22B:
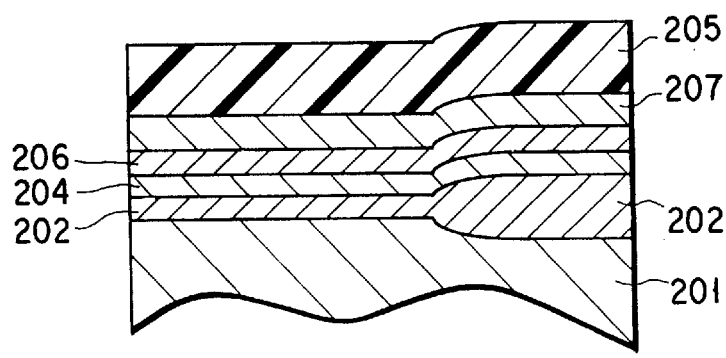
FIG. 22B is a cross-section of another semiconductor device prepared by a lithography method according to the present invention.
Figure 22C:
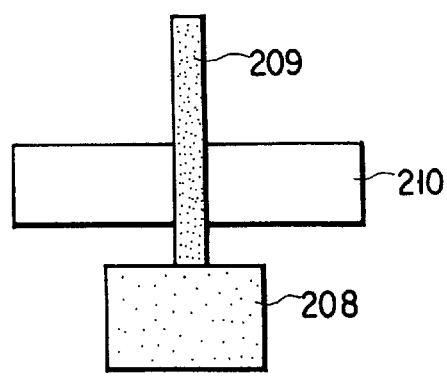
FIG. 22C is a plan view of a gate electrode prepared by a lithography method according to the present invention.

FIGS. 22A, 22B, and 22C are views for explaining an embodiment concerning preparation of a device using a lithography system according to the present invention. The following explanation will be made with reference to an example of gate electrode processing for a MOSFET.

FIG. 22 shows a basic structure of a semiconductor device manufacture in the present embodiment. In the figure, an oxide film 202 for element separation and a gate oxide film 203 are formed on the surface of a semiconductor substrate 201, and a polysilicon region 204 and a resist 205 are further deposited thereon. Although the present embodiment indicates only a gap according to a LOCOS (Local Oxidation of Silicon) method as a selective oxidization method using $Si_3N_4$ as an oxidization mask, the present embodiment may be applied to another element separation method such as a STI (Shallow Trench Isolation) method or the like. The resist 205 is a resist capable of being exposed with deep-UV light and an electron beam such as VN-HS and has a thickness of about 500 nm.

FIG. 22B is a view showing another structure of a semiconductor device manufactured in the present embodiment. In the figure, a gate electrode region consists of a polysilicon region 204 and a low resistance layer region 206 made of, for example, tungsten silicide. A mask material used when tungsten silicide or the like is processed by RIE (Reactive Ion Etching) and a silicon nitride film region 207 used in a SAC (Self Align Contact) step are deposited on the gate electrode region described above, and further, a resist region 205 is deposited thereon. A silicon oxide film may be used as a mask material other than that described above. In addition, the low resistance layer region 206 is not limited to silicide but may be metal such as tungsten or the like.

FIG. 22C is a plan view showing a pattern of an electrode of a gate which is a fine pattern and is therefore to be exposed with an electron beam. In the figure, references 208, 209, and 210 respectively denote a contact pattern, a gate pattern, and a source/drain pattern. In the exposure using an electron beam, the focal depth is as deep as several p m or more and therefore provides a much larger exposure margin for a gap than can stand comparison with that obtained by normal exposure using deep-UV light. Accordingly, patterning can be achieved with high accuracy without any break caused in a gap portion formed between an element region and an element separation region.

In the following, steps of forming a gate electrode according to a semiconductor manufacture method using a lithography system of the present embodiment will be explained with reference to FIGS. 23A, 23B, 23C, and 23D.

Figure 23A:
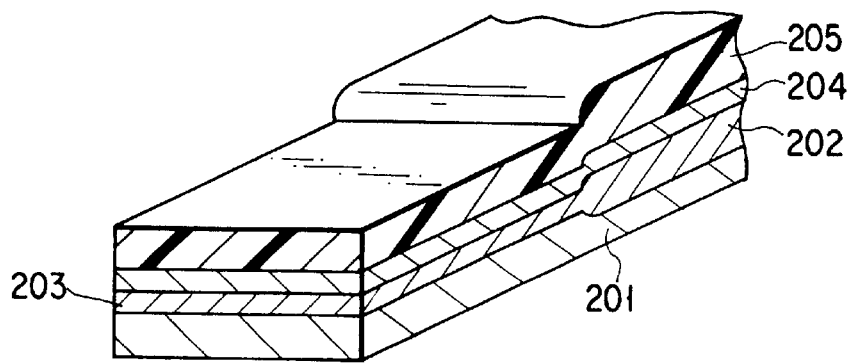
FIG. 23A is a perspective view of a wafer immediately before lithography in case of preparing a gate electrode according to a lithography method of the present invention.

FIG. 23A is a perspective view of the state of FIG. 22A, viewed obliquely from the left side. A gate oxide film region 203 and an element separation oxide film region 202, a polysilicon region 204 (200 nm), and a resist region 205 are layered in this order on a semiconductor substrate 201. The resist is negative and only the gate is formed by electron beam exposure while all the other patterns are formed by exposure using deep-UV light.

Figure 23B:
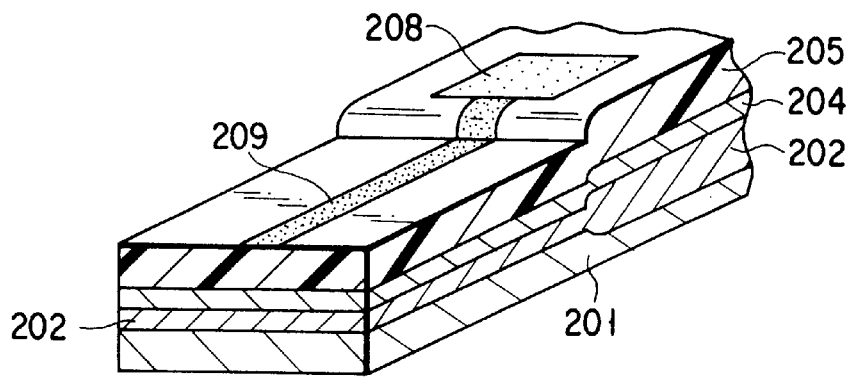
FIG. 23B is a perspective view of a wafer subjected to lithography in a step next to the step shown in FIG. 23B.

At first, pattern exposure using deep-UV light is carried out. FIG. 23B shows a state in which a latent image 208 is formed in a resist by light exposure. Next, an electron beam exposure device is used to detect a latent/base pattern, and the pattern position for electron beam exposure is optimally corrected on the basis of information concerning the detection. Then, exposure of a narrow wiring portion is carried out. A latent image 209 formed by the electron beam exposure is shown in FIG. 23B.

Figure 23C:
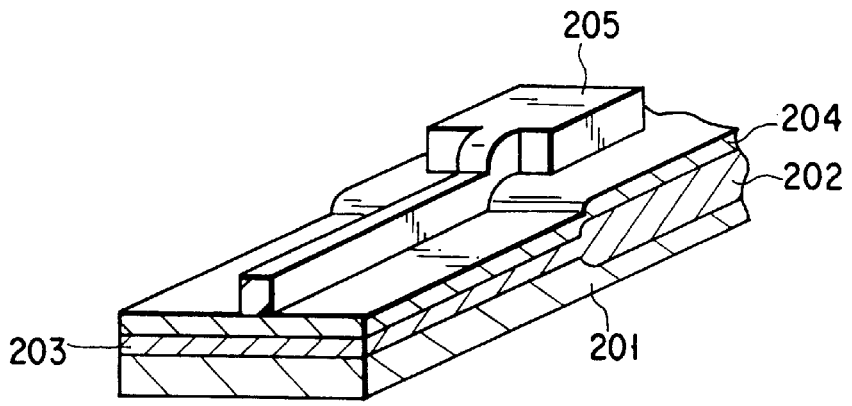
FIG. 23C is a perspective view of a wafer in which a resist has been developed in a step next to the step shown in FIG. 23B.
Figure 23D:
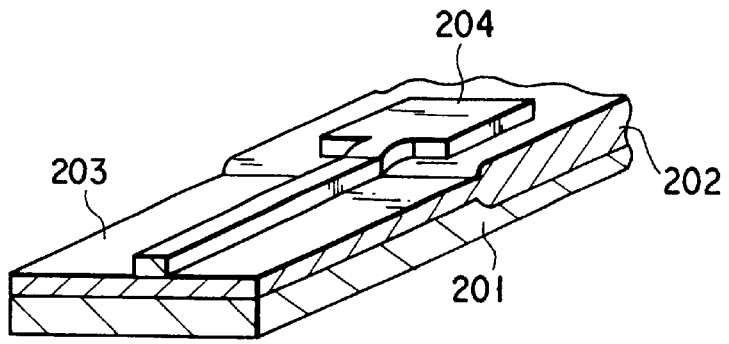
FIG. 23D is a perspective view of a wafer subjected to RIE (etching) in a step next to the step shown in FIG. 23C.

Subsequently, development is carried out to obtain a state shown in FIG. 23C. The development of a resist uses a TMAH solution according to 0.27 rules. Thereafter, an RIE step is performed on the basis of the resist pattern, and a gate electrode having a shape shown in FIG. 23D is obtained.

As shown in FIG. 22B, in case where a gate electrode is constructed in a layered structure consisting of a low-resistance silicide region such as WSi or the like and polysilicon, it is difficult to accomplish consistently RIE to end due to a RIE selection ratio. Therefore, a pattern is once transferred onto a SiN region, and the pattern is used as a mask to further perform RIE on WSi and polysilicon. In case of only polysilicon, the RIE selection ratio with respect to the resist is about 10, and therefore, only a resist mask is naturally sufficient for RIE and is used as a stopper film in a SAC step.

Thus, it is possible to form a resist pattern with achieves excellent resolution performance of electron beam exposure exceeding that of light exposure, a high throughput equivalent to that of a light stepper, and ultra-high-accurate matching due to direct matching. Further, since a margin for focal depth can be obtained with respect to a gap portion which is inevitably formed between an element region and an element separation region by using a an electron beam in exposure of a fine pattern, a fine pattern can be formed with high accuracy. This leads to an advantage in that a flattening step for reducing a gap, which is necessary for light exposure, can be omitted, contributing to shortening the steps. This method is applicable to patterning of a fine small region not only in a MOSFET but also in a bipolar type transistor.

Meanwhile, a positional relationship between a base pattern, a latent image formed by light exposure, and a latent image formed by electron beam exposure can be evaluated before development. This merit can be appropriately utilized to check the layering and matching accuracy of them and predicted resolutions, so that only items of good conditions can be subjected to a developing step. This is a great merit in view of improving the yield of products.

Figure 24:
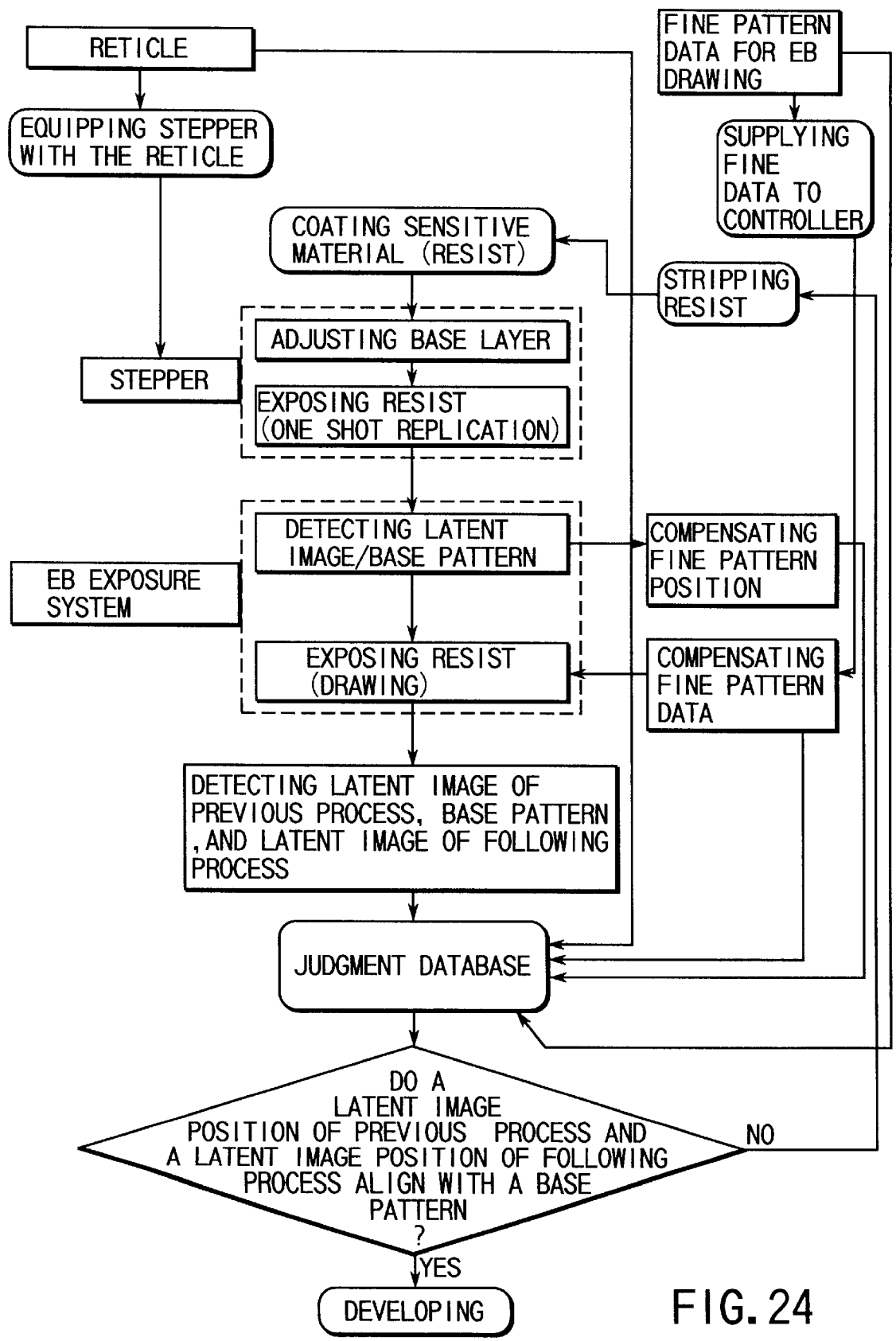
FIG. 24 is a view showing a processing flow of determination of an exposure position error, peeling of a resist, and re-coating.
Figure 25:
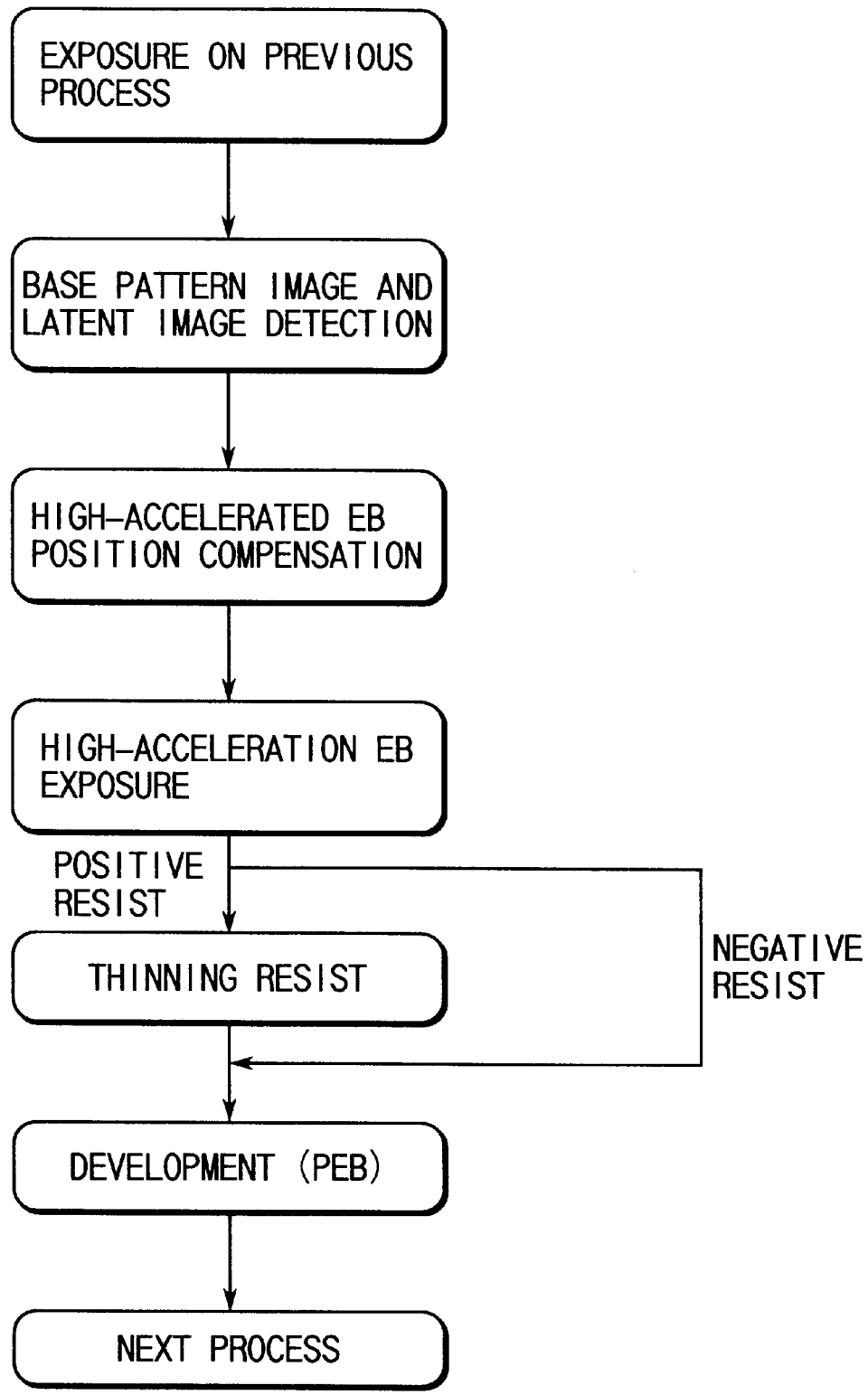
FIG. 25 is a chart showing a processing flow of thinning a resist and removing a portion exposed to an electron beam for detecting a latent image and a base pattern, before development.

FIG. 24 shows a processing flow in case where the function as a merit as described above is incorporated in a lithography step. In the present embodiment, the same procedure as in the embodiment described before is adopted until CAD data for reticles and CAD data for electron beam exposure are prepared from device pattern CAD data to the step and supplied to respective exposure devices, and therefore, explanation thereof will be omitted herefrom.

A latent image is formed in a resist of a wafer which has completely been subjected to steps up to that of electron beam exposure. By subjecting the wafer again to detection by means of an electron beam or light, the position of the latent image formed by electron beam exposure is obtained. In this step, positional information concerning a base pattern, a latent image formed by light exposure, and a latent image formed by electron beam exposure can be all obtained. There may be a case that only one of a base pattern and a latent image formed by light exposure is obtained. In this case, position detection is required for a pattern or a latent image which has not been measured.

Thereafter, whether or not the positions of the pattern and latent images are within a tolerable range is determined. This determination may be made, taking into consideration the design data. As a result of the determination, only permitted items are supplied to a developing step. Wafers which are not permitted are returned again to the resist coating step. Resists once exposed are peeled from those wafers, and pattern formation is carried out again in the Mix and Match lithography step for matching in one same layer.

A device used in this step is simply added with a means for comparing positional information of a base pattern, a latent image formed by light exposure, and a latent image formed by electron beam exposure, with design data of patterns, thereby to determine whether or not positions are within a range of tolerable values. Operation of the device is substantially the same as the operation performed with respect to a wafer in electron beam exposure, except that an electron beam used for exposure is not irradiated onto wafers.

If comparison is previously made between a latent image and a resist pattern after development, it is possible to predict a shape of a finished pattern. Further, if a relationship between a latent image and a size of a finished resist under a certain processing condition is previously obtained, it is possible to predict a size of finished resist from data of a latent image.

As a result of this, items of bad conditions can further be chosen and removed, so that resist patterns obtained after development can be resist masks which will cause no problems with respect to subsequent processing. This contributes to improvements of yield much more.

In addition, observation of a latent image formed by a Mix and Match method for one same layer may be performed by the device described above or may be performed by a device for latent image observation so that the position accuracy, shape, and size of the latent image. It suffices that determination is made as to whether or not values are in a tolerable range by comparing data concerning the latent image with design data and steps are proceeded as described above. In this case, the drawing device is not occupied by observation of a latent image, but the drawing device draws a mask for transfer with respect to a next wafer and a specialized observation device is used for observing a latent image. This contributes to further improvements of a drawing throughput of the entire system.

Next, a relationship between a film thickness of a rest and an observation electron beam will be described in case where exposure is performed with use of a substance whose resistance value and electrostatic capacity before exposure differ from those after exposure.

A latent image can be observed by means of a characteristic that the resistance value and the electrostatic capacity of an exposed portion differ from those of an unexposed portion. In this observation, a resist may be exposed due to a S/N ratio of a detection signal during observation of a latent image.

Under conditions as described above, a latent image was observed and was used for position matching in a later step. Thereafter, developing processing was carried out. Examples of the results are shown in microscopic photographs by a SEM in FIG. 26. In the figure, a reference 1701 denotes a pattern exposed by an electron beam of 50 kV, and a reference 1702 denotes a pattern exposed by an electron beam of 2 kV. In this case, an acceleration voltage of 2 kV was used for the electron beams. After the surface of a resist patterned by a high-accelerated electron beam was observed with an electron beam of 2 kV, the resist remained like a skin since a negative resist was used. However, it can be found that a pattern formed by high acceleration exists in the lower region exposed by observation by low acceleration.

Figure 26:
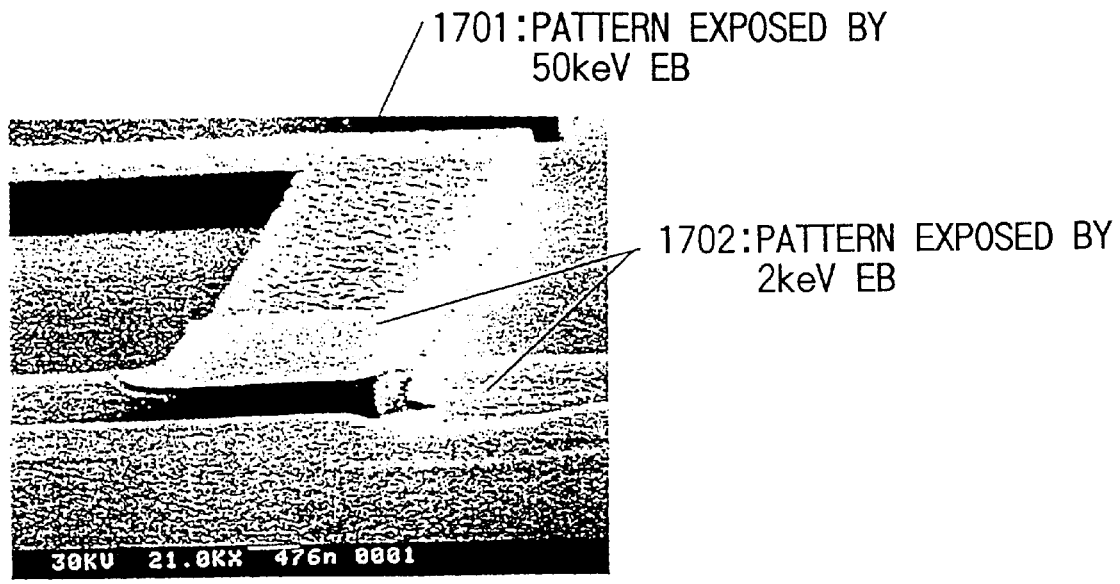
FIG. 26 shows examples of resist images after development was carried out after latent image observation.
Figure 26:
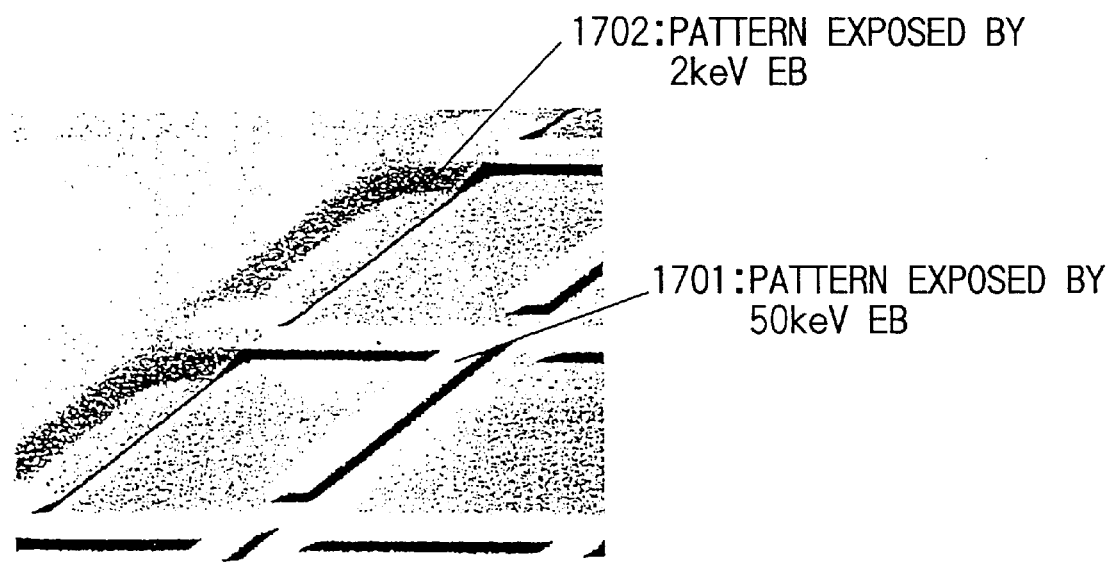

In this case, before development processing is carried out after latent image observation, a wet or dry technique is used to remove a resist of a thickness equivalent to the region exposed with an acceleration voltage used in latent image observation, from the entire surface of the wafer. Practically, like in the embodiment described before, latent image observation is carried out with a low-accelerated electron beam (in step S1), and a positional correction of a high-accelerated electron beam (in a step S2) and exposure of a pattern by a high-accelerated electron beam (in a step S3) are carried out on the basis of the results of the observation. Subsequently, the resist is removed by an arbitrary film thickness (in a step S4), and thereafter, normal development processing is carried out. In this manner, a film exposed by latent image observation, as shown in FIG. 26, can be removed, and a desired pattern can be obtained.

In case of using a positive resist, the region subjected to latent image observation may be thinned after development on the contrary to the case of a negative resist, but no problems are caused therefrom. Therefore, in case of a positive resist, a step (S4) of removing an arbitrary resist film is not always necessary. However, there are no problems even if the same processing as in case of a negative resist is carried out in case of a positive resist.

The present invention is not limited to the embodiments described above. A light stepper is not always limited to a deep-UV stepper but may adopt a different wavelength range. An electron beam exposure device should most desirably be of a cell-projection type, but may be of a normal drawing type in case where the number of patterns to be formed in electron beam exposure is small. The number of light steppers and the number of electron beam exposure devices used in a production line may be appropriately changed in accordance with specifications. Further, it is possible to use an ion beam exposure device using an ion beam in place of an electron beam.

Figure 27A:
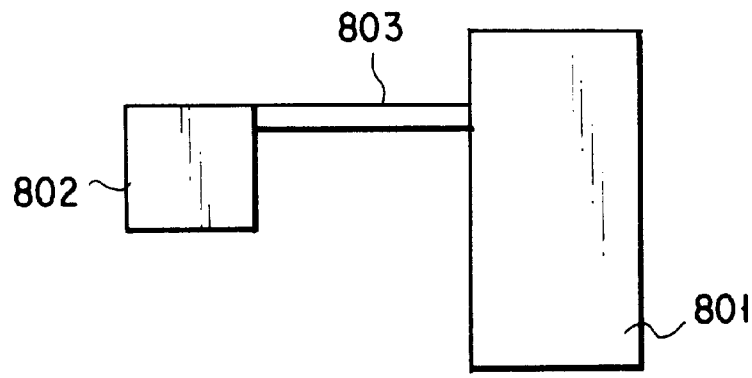
FIGS. 27A to 27C are schematic views for explaining modification examples of the present invention.
Figure 27B:
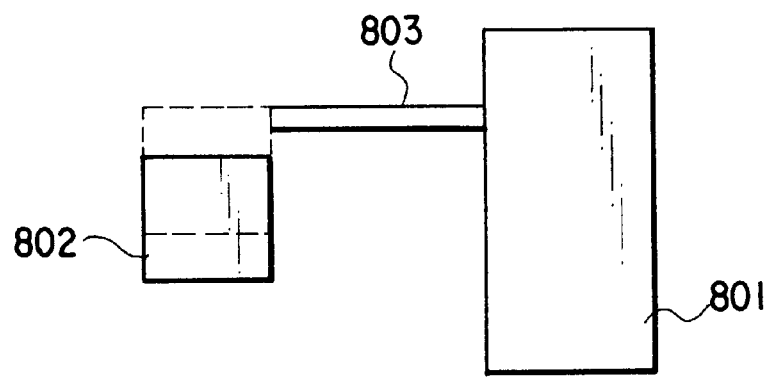
Figure 27C:
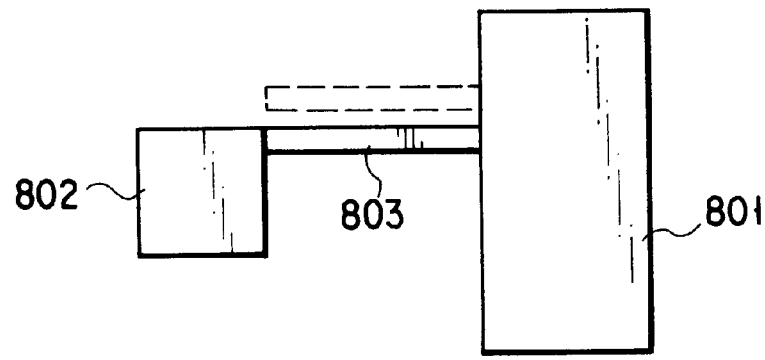

Also, the present invention is not limited to a case where exposure is performed by each of different devices but may be applied to correct a displacement in case where exposure is performed by one same device. For example, as for a pattern as shown in FIG. 27A, it is supposed that only an exposure pattern 802 is displaced due to an external disturbance in case where exposure is performed on patterns 801, 802, and 803 in this order with use of a high-accelerated electron beam. In this condition, the exposure pattern 802 is formed apart from the exposure pattern 803. In this case, a latent image of the exposure pattern 802 is detected by a low-accelerated electron beam, and the exposure position of the pattern 803 is corrected. As a result, the exposure patterns 802 and 803 are connected with each other as shown in FIG. 27C.

In the above embodiments, explanation has been made mainly with respect to a gate electrode of a MOSFET. However, the same methods as in the embodiments are applicable to any patterning such as patterning of a contact hole, a metal wiring layer, or the like. Further, the present invention can be variously modified in practice without deriving from the range of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A pattern forming method of forming a desired pattern on a sensitive material coated on a substrate, comprising:
    a first step of transferring a first pattern by exposing the sensitive material;
    a second step of transferring a second pattern by exposing the sensitive material, the desired pattern being expressed as a synthesize pattern consisting of the first and second pattern; and
    a third step of adjusting an exposure position of the second pattern, based on a latent image of the first pattern formed in the sensitive material.

2. A method according to claim 1, further comprising a step of detecting the latent image by means of a charge beam.

3. A method according to claim 2, wherein energy of the charge beam for detecting the latent image is set such that a surface portion of the sensitive material is exposed while a portion of the sensitive material which is deeper than the surface portion is not exposed.

4. A method according to claim 3, further comprising:
    a step of thinning the sensitive material; and
    a step of developing the sensitive material thinned, so that the sensitive material developed remains in form of only the first and second patterns.

5. A method according to claim 2, wherein energy of the charge beam for detecting the latent image is set such that exposure depth of the charge depth is shallower than exposure depth of the first and second patterns.

6. A method according to claim 5, further comprising:
    a step of thinning the sensitive material; and
    a step of developing the sensitive material thinned, so that the sensitive material developed remains in form of only the first and second patterns.

7. A method according to claim 1, wherein the second pattern is transferred by exposing the sensitive material with a charge beam, the latent image is detected by a charge beam, and energy of the charge beam for detecting the latent image is set to be lower than energy of the charge beam for transferring the second pattern by exposing the sensitive material.

8. A method according to claim 2, wherein the sensitive material has a characteristic that at least one of a resistance value and an electrostatic capacity of the sensitive material is changed by exposure.

9. A method according to claim 1, wherein the sensitive material is exposed with light passing through a reticle mask in the first step, and the sensitive material is exposed with a charge beam in the second step.

10. A method according to claim 1, further comprising:
    a step of evaluating whether or not a position of the first pattern formed in the sensitive material in the first step is displaced by a predetermined distance or more from a designed position; and
    a step of peeling the sensitive material from the substrate and of coating again a sensitive material, if the position of the latent image of the first pattern is displaced by the predetermined distance or more from the designed position.

11. A method according to claim 1, wherein the first pattern is transferred by exposing the sensitive material with a charge beam in the first step.

12. A method according to claim 1, wherein the latent image of the first pattern is detected by irradiating light, and the light has a wavelength which cannot be sensed by the sensitive material or an irradiation amount of the light is set to be smaller than an irradiation amount by which the sensitive material is sensed.

13. A pattern forming method for forming a desired pattern in a sensitive material formed on a substrate, comprising:
    a first step of transferring the desired pattern by exposing the sensitive material; and
    a second step of adjusting an exposure position of the desired pattern, based on a base pattern of the substrate below the sensitive material.

14. A method according to claim 13, further comprising a step of detecting the base pattern by means of a charge beam.

15. A method according to claim 14, wherein energy of the charge beam for detecting the base pattern is set such that a surface portion of the sensitive material is exposed while a portion of the sensitive material which is deeper than the surface portion is not exposed.

16. A method according to claim 15, further comprising:
    a step of thinning the sensitive material; and
    a step of developing the sensitive material thinned, so that the sensitive material developed remains in form of only the desired pattern.

17. A method according to claim 14, wherein energy of the charge beam for detecting the base pattern is set such that exposure depth of the charge beam is shallower than exposure depth of the first and second patterns.

18. A method according to claim 17, further comprising:
    a step of thinning the sensitive material; and
    a step of developing the sensitive material thinned, so that the sensitive material developed remains in form of only the desired pattern.

19. A method according to claim 13, wherein the desired pattern is transferred by exposing the sensitive material with a charge beam, the base pattern is detected by a charge beam, and energy of the charge beam for detecting the base pattern is set to be lower than energy of the charge beam for transferring the desired pattern by exposing the sensitive material.

20. A method according to claim 13, wherein the sensitive material has a characteristic that at least one of a resistance value and an electrostatic capacity of the sensitive material is changed by exposure.

21. A method according to claim 13, further comprising:
    a step of evaluating whether or not a position of the desired pattern formed in the sensitive material is displaced by a predetermined distance or more from the base pattern; and
    a step of peeling the sensitive material from the substrate and of coating again a sensitive material, if the position of the latent image of the desired pattern is displaced by the predetermined distance or more from the base pattern.

22. A method according to claim 13, further comprising a step of detecting the base pattern by irradiating light, the light having a wavelength which cannot be sensed by the sensitive material or having an irradiation amount set to be smaller than an irradiation amount which the sensitive material senses.

* * * * *